(12) United States Patent
Huang et al.

(10) Patent No.: US 12,322,651 B2
(45) Date of Patent: *Jun. 3, 2025

(54) ETCHING TO REDUCE LINE WIGGLING

(71) Applicant: Taiwan Semiconductor Manufacturing Co., Ltd., Hsinchu (TW)

(72) Inventors: Kuan-Wei Huang, Taoyuan (TW); Cheng-Li Fan, New Taipei (TW); Yu-Yu Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/586,412

(22) Filed: Jan. 27, 2022

(65) Prior Publication Data

US 2022/0148918 A1 May 12, 2022

Related U.S. Application Data

(63) Continuation of application No. 16/679,940, filed on Nov. 11, 2019, now Pat. No. 11,244,858, which is a
(Continued)

(51) Int. Cl.
*H01L 21/786* (2006.01)
*H01L 21/033* (2006.01)
(Continued)

(52) U.S. Cl.
CPC .... *H01L 21/76877* (2013.01); *H01L 21/0332* (2013.01); *H01L 21/0337* (2013.01); *H01L 21/31138* (2013.01); *H01L 21/31144* (2013.01); *H01L 21/76829* (2013.01); *H01L 21/76841* (2013.01); *H01L 23/5226* (2013.01);
(Continued)

(58) Field of Classification Search
None
See application file for complete search history.

(56) References Cited

U.S. PATENT DOCUMENTS 7,351,667 B2   4/2008   Hwang et al.
8,601,416 B2  12/2013   Kuo et al.
(Continued)

FOREIGN PATENT DOCUMENTS

CN   101221899 A   7/2008
KR   20100093549 A   8/2010
(Continued)

*Primary Examiner* — Nilufa Rahim
(74) *Attorney, Agent, or Firm* — Slater Matsil, LLP

(57) ABSTRACT

A method for reducing wiggling in a line includes forming a first patterning layer over a metal feature and depositing a first mask layer over the first patterning layer. The first mask layer is patterned to form a first set of one or more openings therein and then thinned. The pattern of the first mask layer is transferred to the first patterning layer to form a second set of one or more openings therein. The first patterning layer is etched to widen the second set of one or more openings. The first patterning layer may be comprised of silicon or an oxide material. The openings in the first patterning layer may be widened while a mask layer is over the first patterning layer.

20 Claims, 30 Drawing Sheets

Related U.S. Application Data continuation of application No. 15/726,035, filed on Oct. 5, 2017, now Pat. No. 10,475,700.

(60) Provisional application No. 62/552,490, filed on Aug. 31, 2017.

(51) Int. Cl.
*H01L 21/311* (2006.01)
*H01L 21/768* (2006.01)
*H01L 23/522* (2006.01)
*H01L 23/532* (2006.01)
*H01L 23/535* (2006.01)

(52) U.S. Cl.
CPC .. *H01L 23/53228* (2013.01); *H01L 23/53257* (2013.01); *H01L 23/535* (2013.01); *H01L 21/31111* (2013.01); *H01L 21/31116* (2013.01)

(56) References Cited

U.S. PATENT DOCUMENTS

| | | |
|---|---|---|
| 8,728,332 B2 | 5/2014 | Lin et al. |
| 8,762,900 B2 | 6/2014 | Shin et al. |
| 8,775,993 B2 | 7/2014 | Huang et al. |
| 8,796,666 B1 | 8/2014 | Huang et al. |
| 8,809,185 B1 | 8/2014 | Feurprier |
| 8,822,243 B2 | 9/2014 | Yan et al. |
| 8,887,116 B2 | 11/2014 | Ho et al. |
| 8,987,142 B2 | 3/2015 | Lee et al. |
| 9,053,279 B2 | 6/2015 | Chang et al. |
| 9,093,530 B2 | 7/2015 | Huang et al. |
| 9,099,530 B2 | 8/2015 | Lin et al. |
| 9,153,478 B2 | 10/2015 | Liu et al. |
| 9,501,601 B2 | 11/2016 | Chang et al. |
| 9,548,303 B2 | 1/2017 | Lee et al. |
| 9,779,944 B1 * | 10/2017 | Burns ................. H01L 21/0337 |
| 10,607,850 B2 * | 3/2020 | Surla ....................... H01L 28/00 |
| 2004/0021196 A1 | 2/2004 | Brennan et al. |
| 2004/0127016 A1 | 7/2004 | Hoog et al. |
| 2009/0115064 A1 | 5/2009 | Sandhu et al. |
| 2010/0130016 A1 | 5/2010 | DeVilliers |
| 2011/0159699 A1 * | 6/2011 | Gabriel ............. H01L 21/31138 257/E21.536 |
| 2012/0003838 A1 | 1/2012 | Ookuma et al. |
| 2012/0129338 A1 * | 5/2012 | Kirimura .......... H01L 21/76811 257/E21.577 |
| 2013/0005147 A1 | 1/2013 | Angyal et al. |
| 2013/0023119 A1 | 1/2013 | Park et al. |
| 2014/0021196 A1 | 1/2014 | Hoffmann et al. |
| 2014/0101623 A1 | 4/2014 | Chen et al. |
| 2014/0201692 A1 | 7/2014 | Chen et al. |
| 2014/0237435 A1 | 8/2014 | Chen et al. |
| 2014/0242794 A1 * | 8/2014 | Lin .................. H01L 21/31144 438/667 |
| 2014/0282337 A1 | 9/2014 | Yuh et al. |
| 2014/0304670 A1 | 10/2014 | Su et al. |
| 2014/0310675 A1 | 10/2014 | Liu et al. |
| 2014/0325464 A1 | 10/2014 | Hsu et al. |
| 2015/0093902 A1 | 4/2015 | Huang et al. |
| 2015/0147882 A1 | 5/2015 | Yao et al. |
| 2015/0162238 A1 | 6/2015 | Huang et al. |
| 2016/0276211 A1 * | 9/2016 | Horikoshi ......... H01L 21/76826 |
| 2017/0194242 A1 * | 7/2017 | Huang ............. H01L 21/76813 |

FOREIGN PATENT DOCUMENTS

| | | |
|---|---|---|
| KR | 20130010360 A | 1/2013 |
| KR | 20150014387 A | 2/2015 |
| TW | 201203348 A | 1/2012 |
| TW | 201245894 A | 11/2012 |

\* cited by examiner

ETCHING TO REDUCE LINE WIGGLING

PRIORITY CLAIM AND CROSS-REFERENCE

This application is a continuation of U.S. patent application Ser. No. 16/679,940, Nov. 11, 2019, entitled "Etching to Reduce Line Wiggling", which is a continuation of U.S. patent application Ser. No. 15/726,035, filed on Oct. 5, 2017, entitled "Etching to Reduce Line Wiggling," now U.S. Pat. No. 10,475,700, issued Nov. 12, 2019, which claims priority to U.S. Provisional Patent Application No. 62/552,490, entitled "Etching to Reduce Line Wiggling," filed on Aug. 31, 2017, which application is hereby incorporated herein by reference.

BACKGROUND

In order to form integrated circuits on wafers, lithography process is used. A typical lithography process involves applying a photo resist, and defining patterns on the photo resist. The patterns in the patterned photo resist are defined in a lithography mask, and are defined either by the transparent portions or by the opaque portions in the lithography mask. The patterns in the patterned photo resist are then transferred to the underlying features through an etching step, wherein the patterned photo resist is used as an etching mask. After the etching step, the patterned photo resist is removed.

With the increasing down-scaling of integrated circuits, high aspect ratio stacking of layers used in photo patterning techniques can lead to poor wiggling resistance during pattern transfer to an amorphous silicon substrate. Line wiggling can, in turn, lead to pattern defects. Pattern defects and line wiggling can result in in breaking metal pattern lines and cause the pattern to fail.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
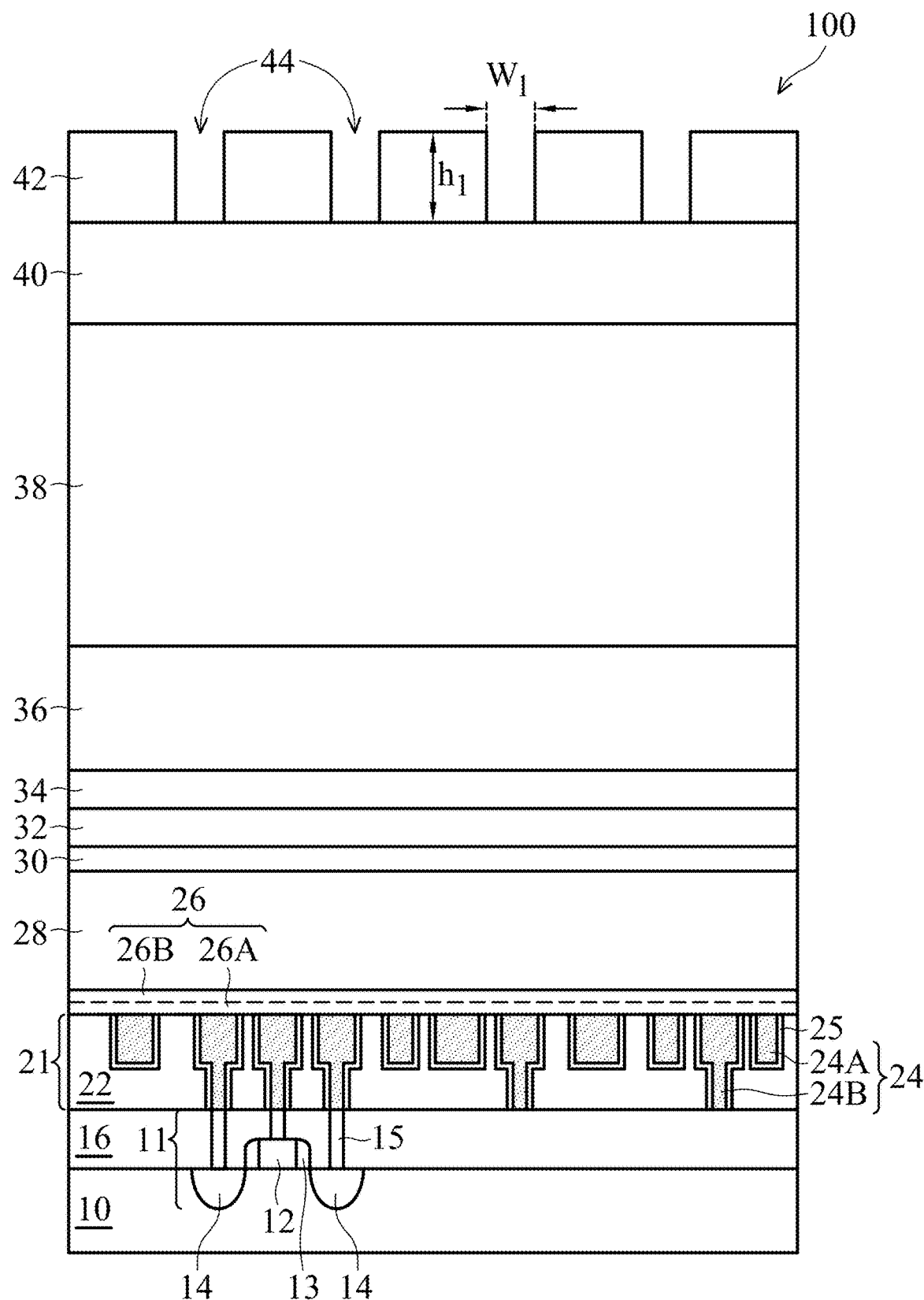
FIGS. 1 through 11 illustrate intermediate steps of a self-aligned double patterning method of forming a metal line having a reduced wiggle, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present invention provide a method of producing metal lines which reduce the amount of line wiggle in the formation of metal lines. Line wiggle occurs when a pattern defined by a high aspect ratio, height-to-width, of a mask layer is transferred onto an pattern layer underneath which is used to define openings corresponding to the metal lines. Line wiggle in the mask layer is transferred to the pattern layer and line wiggle in the pattern layer is transferred to the line layer. Embodiments discussed below reduce the height-to-width aspect ratio of another pattern layer which is used to define the mask layer, resulting in a mask layer with less line wiggle which transfers to the subsequent layers to provide a line layer also with less wiggle. As such, the metal lines will also have less line wiggle. Embodiments can be used to provide metal lines resulting from multiple patterning techniques, such as a self-aligned double patterning (SADP) or two-patterning-two-etching (2P2E) techniques. Intermediate stages of forming a metal line using these techniques are illustrated in accordance with example embodiments.

FIGS. 1 through 11 illustrate cross-sectional views of intermediate stages in the formation of features in a target layer in accordance with some embodiments using a self-aligned double patterning process. FIG. 1 illustrates device 100, which includes substrate 10 and the overlying layers. Substrate 10 may be formed of a semiconductor material such as silicon, silicon germanium, or the like. In some embodiments, substrate 10 is a crystalline semiconductor substrate such as a crystalline silicon substrate, a crystalline silicon carbon substrate, a crystalline silicon germanium substrate, a III-V compound semiconductor substrate, or the like. In an embodiment the substrate 10 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Devices 20 may include both active devices and passive devices and are formed at a top surface of or within substrate 10. Active devices may comprise a wide variety of active devices such as transistors and the like and passive devices may comprise devices such as capacitors, resistors, inductors and the like that together may be used to generate the desired structural and functional parts of the design. The active devices and passive devices may be formed using any suitable methods either within or else on the substrate 10. For example, one device of devices 20 may be transistor 11, which includes a gate electrode 12, gate spacers 13, and source/drain regions 14. Gate and source/drain contacts 15 can be used to electrically couple to transistor 11. Transistor 11 may be a fin or planar field effect transistor (FET), and may be an n-type or p-type transistor or part of a complimentary metal-oxide semiconductor (CMOS). A dielectric layer 16 may include one or more layers of dielectric material in which contact structures 15 are electrically coupled to active devices and passive devices.

Metallization structure 21 is formed over substrate 10. Metallization structure 21 includes a dielectric layer 22 with conductive features 24 formed therein. Metallization structure 21 may be a layer of an interconnect or redistribution structure which may have additional layers. For example, metallization structure 21 may include an dielectric layer 22, such as an Inter-Metal Dielectric (IMD) layer or an Inter-Layer Dielectric (ILD) layer, which may include a dielectric material having a low dielectric constant (k value) lower than 3.8, lower than about 3.0, or lower than about 2.5, for example, and conductive features 24. The dielectric layer 22 of the metallization structure 21 may be formed of phosphosilicate glass (PSG), borosilicate glass (BSG), boron-doped phosphosilicate glass (BPSG), fluorine-doped silicate glass (FSG), tetraethyl orthosilicate (TEOS), Black Diamond (a registered trademark of Applied Materials Inc.), a carbon-containing low-k dielectric material, Hydrogen SilsesQuioxane (HSQ), MethylSilsesQuioxane (MSQ), or the like.

Metallization structure 21 (including one or more layers) is formed over the substrate 10 and the devices 20 and is designed to connect the various devices 20 to form functional circuitry for the circuit design. In an embodiment, the metallization structure 21 is formed of alternating layers of dielectric and conductive material and may be formed through any suitable process (such as deposition, damascene, dual damascene, etc.). In an embodiment there may be one to four layers of metallization separated from the substrate 10 by at least one interlayer dielectric layer (ILD), but the precise number of layers is dependent upon the design.

The conductive features 24 may include metal lines 24A and conductive vias 24B. Metal lines 24A may be formed in an upper portion of a layer of the metallization structure 21, and may be used for routing signals. Conductive vias 24B may extend through the dielectric layer 22 to contact underlying features. In an embodiment, the conductive features 24 may be a material such as copper formed using, e.g., a damascene or dual damascene process, whereby an opening is formed within the metallization layer 22, the opening is filled and/or overfilled with a conductive material such as copper or tungsten, and a planarization process is performed to embed the conductive material 24 within the metallization layer 22. However, any suitable material and any suitable process may be used to form the conductive features 24. In some embodiments, a barrier layer 25 may surround the conductive elements 24 and may be used as a diffusion barrier layer for preventing undesirable elements, such as copper, from diffusing into the surrounding dielectric material of the metallization layer 22, for example, if the dielectric material of the metallization layer 22 is a low-k dielectric material. In some embodiments, conductive features 24 may be contacts of a die.

Etch stop layer (ESL) 26 may comprise a dielectric material such as silicon carbide, silicon nitride, or the like. ESL 26 may be formed of a nitride, a silicon-carbon based material, a carbon-doped oxide, and/or combinations thereof. ESL 26 may be formed of a metallic material. The formation methods include Plasma Enhanced Chemical Vapor Deposition (PECVD) or other methods such as High-Density Plasma CVD (HDPCVD), Atomic Layer Deposition (ALD), low pressure CVD (LPCVD), physical vapor deposition (PVD), and the like. In accordance with some embodiments, a dielectric layer 26 is also used as a diffusion barrier layer for preventing undesirable elements, such as copper, from diffusing into the subsequently formed low-k dielectric layer. ESL 26 may include Carbon-Doped Oxide (CDO), carbon-incorporated silicon oxide (SiOC) or oxygen-Doped Carbide (ODC). ESL 26 may also be formed of Nitrogen-Doped silicon Carbide (NDC).

ESL 26 may comprise one or more distinct layers. In some embodiments, a first etch stop layer 26A is used to protect the underlying structures and provide a control point for a subsequent etching process through, for example, the second etch stop layer 26B. The first etch stop layer 26A may be deposited to a thickness of between about 15 Å and about 50 Å, such as about 30 Å. Other suitable thicknesses may be used.

Once the first etch stop layer 26A has been formed to cover the conductive elements 24, in some embodiments, a second etch stop layer 26B is formed over the first etch stop layer 26A. In some embodiments, the second etch stop layer 26B is formed of a material different than the first etch stop layer 26A. The material of the second etch stop layer 26B may be formed using a deposition process such as those listed above, and may be deposited to a thickness of between about 15 Å and about 35 Å, such as about 20 Å. However, any suitable process of formation and thickness may be utilized.

Further illustrated in FIG. 1 is dielectric layer 28 formed over etch stop layer 26. In accordance with some embodiments of the present disclosure, dielectric layer 28 is formed of a low-k dielectric material having a dielectric constant (k-value) lower than about 3.0, about 2.5, or even lower. Dielectric layer 28 may be formed using a material selected from the same group of candidate materials for forming dielectric layer 22. When selected from the same group of candidate materials, the materials of dielectric layers 22 and 28 may be the same or different from each other. In accordance with some embodiments, dielectric layer 28 is a silicon and carbon containing low-k dielectric layer. Dielectric layer 28 may also be referred to as a target layer, which will have openings formed therein according to a plurality of patterns and filled with metal lines and plugs, in accordance with embodiments of the present disclosure.

In some embodiments, over low-k dielectric layer 28 resides a mask 30. In some embodiments, mask 30 may be a dielectric hard mask and may be referred to as dielectric hard mask 30, which may be formed of silicon oxide (such as tetraethylorthosilicate (TEOS) oxide), Nitrogen-Free Anti-Reflective Coating (NFARC, which is an oxide), silicon carbide, silicon oxynitride, or the like. The formation methods include Plasma Enhance Chemical Vapor Deposition (PECVD), High-Density Plasma (HDP) deposition, or the like.

A mask 32 is formed over mask 30 or dielectric layer 28. In some embodiments mask 32 may be a hard mask and may also be referred to as hard mask 32. In some embodiments, hard mask 32 is a metal hard mask and may include one or more metals, such as titanium (Ti) or tantalum (Ta). In some embodiments, the metal of hard mask 32 may be in the form of a metal nitride such as titanium nitride (TiN) or tantalum nitride (TaN). In some embodiments, hard mask 32 may be formed of a non-metal nitride such as silicon nitride, an oxynitride such as silicon oxynitride, or the like. The formation methods of hard mask 32 include Physical Vapor Deposition (PVD), Radio Frequency PVD (RFPVD), Atomic Layer Deposition (ALD), or the like.

Dielectric mask 34 is formed over mask 32. In some embodiments, dielectric mask 34 may be a hard mask and may be referred to as dielectric hard mask 34. Dielectric hard mask 34 may be formed of a material selected from the same candidate material of dielectric hard mask 30, and may be formed using a method that is selected from the same group of candidate methods for forming dielectric hard mask 30. Dielectric hard masks 30 and 34 may be formed of the same material, or may comprise different materials. In some embodiments, dielectric hard mask 34 may be patterned after deposition to expose portions of the underlying hard mask 32. In such embodiments, the dielectric hard mask 34 may be used to etch the underlying target layer 36 to different depths.

Mandrel layer 36 is formed over dielectric hard mask 34. In some embodiments, mandrel layer 36 is formed of amorphous silicon or another material that has a high etching selectivity with the underlying dielectric hard mask 34. Mandrel layer 36 may have a thickness of about 300 to about 800 Å, such as about 500 Å. In some embodiments, Mandrel layer 36 may be a mandrel layer such as when using a self-aligned double patterning (SADP) technique. In some embodiments, Mandrel layer 36 may be a pattern mask layer to be used in a one-patterning-one-etching (1P1E) process. In accordance with some embodiments, such a pattern mask layer may be used in a two-patterning-two-etching (2P2E) process, wherein two neighboring openings (see, e.g., openings 78 and openings 80 of FIG. 19B) are formed in different lithography processes, so that neighboring openings may be located close to each other without incurring optical proximity effect. Additional patterning steps can be used on mandrel layer 36, such as three-patterning-three-etching (3P3E), and so on, or combinations of the techniques discussed above. Multiple patterning techniques are discussed below in conjunction with FIGS. 12-21.

After mandrel layer 36 is patterned (see layer 236 of FIG. 6), it will be used in a subsequent process as mandrels for a self-aligned patterning process which will result in patterning the target layer 28. When the height-to-width aspect ratio of the openings is high, the resulting metal features (e.g., metal lines) in the target layer 28 will wiggle, i.e., not be relatively straight, as a result of the etch process. Embodiments discussed herein control the height-to-width ratio of the openings which will be formed which result in metal features which have little to no wiggle.

Still referring to FIG. 1, a tri-layer is formed over the mandrel layer 36, the tri-layer comprising a bottom layer 38, a middle layer 40 over the bottom layer 38, and an upper layer 42 (also referred to as top layer) over the middle layer 40. In some embodiments, bottom layer 38 and upper layer 42 are formed of photo resists, which comprise organic materials. Middle layer 40 may comprise an inorganic material, which may be a carbide (such as silicon oxycarbide), a nitride (such as silicon nitride), an oxynitride (such as silicon oxynitride), an oxide (such as silicon oxide), or the like. Middle layer 40 has a high etching selectivity relative to upper layer 42 and bottom layer 38, and hence upper layer 42 is used as an etching mask for the patterning of middle layer 40, and middle layer 40 is used as an etching mask for the patterning of bottom layer 38.

The thickness of the bottom layer 38 may be between about 250 and 1200 Å, such as about 500 Å. The thickness of the middle layer 40 may be between about 100 and 350 Å, such as about 260 Å. The thickness of the upper layer 42 may be between about 300 and 1000 Å, such as about 500 Å. Although example ranges and thicknesses of the layers are provided, other thicknesses of these layers can be used.

After the upper layer 42 is formed, upper layer 42 is patterned as illustrated in FIG. 1 using an acceptable photolithography technique. The patterned upper layer 42 includes openings 44 therein. In a top view of device 100, openings 44 may have shapes such as strips, round vias, or conductive patterns. Each of the openings 44 has a height-to-width ratio, $h_1:w_1$. In some embodiments, the height $h_1$ of the openings 44 corresponds to the thickness of the top layer 42 and the width $w_1$ of the openings 44 depends on the photolithography technique used to pattern the top layer 42. The width $w_1$ of the openings 44 may be between about 150 and 500 Å, such as about 300 Å. Other widths for the openings 44 can be used.

Figure 2:
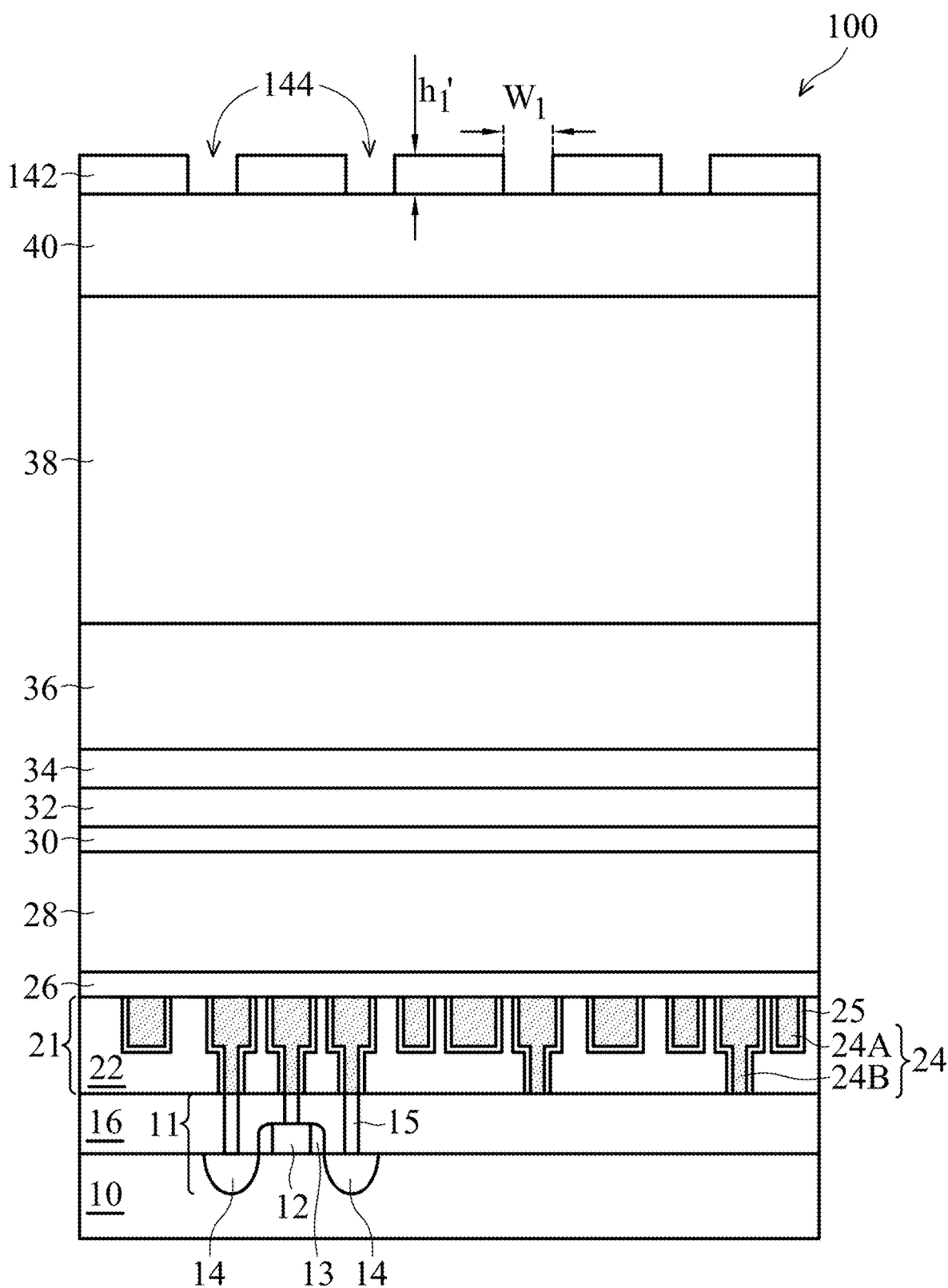

Next, referring to FIG. 2, in order to reduce the height-to-width ratio of the openings 44, the thickness of the upper layer 42 (and corresponding height $h_1$ of the openings 44 of FIG. 1) is reduced to a height $h_1'$. Any acceptable technique may be used to reduce the height of the openings 44 to create openings 144. For example an anisotropic etch may be performed which is selective to the material of the upper layer 42. In some embodiments, a CMP may be used to reduce the thickness of the upper layer 42 to create layer 142. The reduced height-to-width ratio, $h_1':w_1$, may be between about 0.5 and 2.0, such as about 1.0. In some embodiments, the width $w_1$ may be changed to a width $w_1'$, for example, if the openings 44 of FIG. 1 are widened in the same process which reduces the height of the upper layer 42. In such embodiments, the resulting height-to-width ratio $h_1':w_1'$ may be reduced over the ratio $h_1:w_1$ by an even greater extent.

The reduction of the height-to-width ratio of the openings 44 in the top layer 42 can be performed so that the subsequent etching of the middle layer 40 will have straighter etched lines than if the top layer was not thinned to change the height-to-width ratio of the openings 44.

Figure 3:
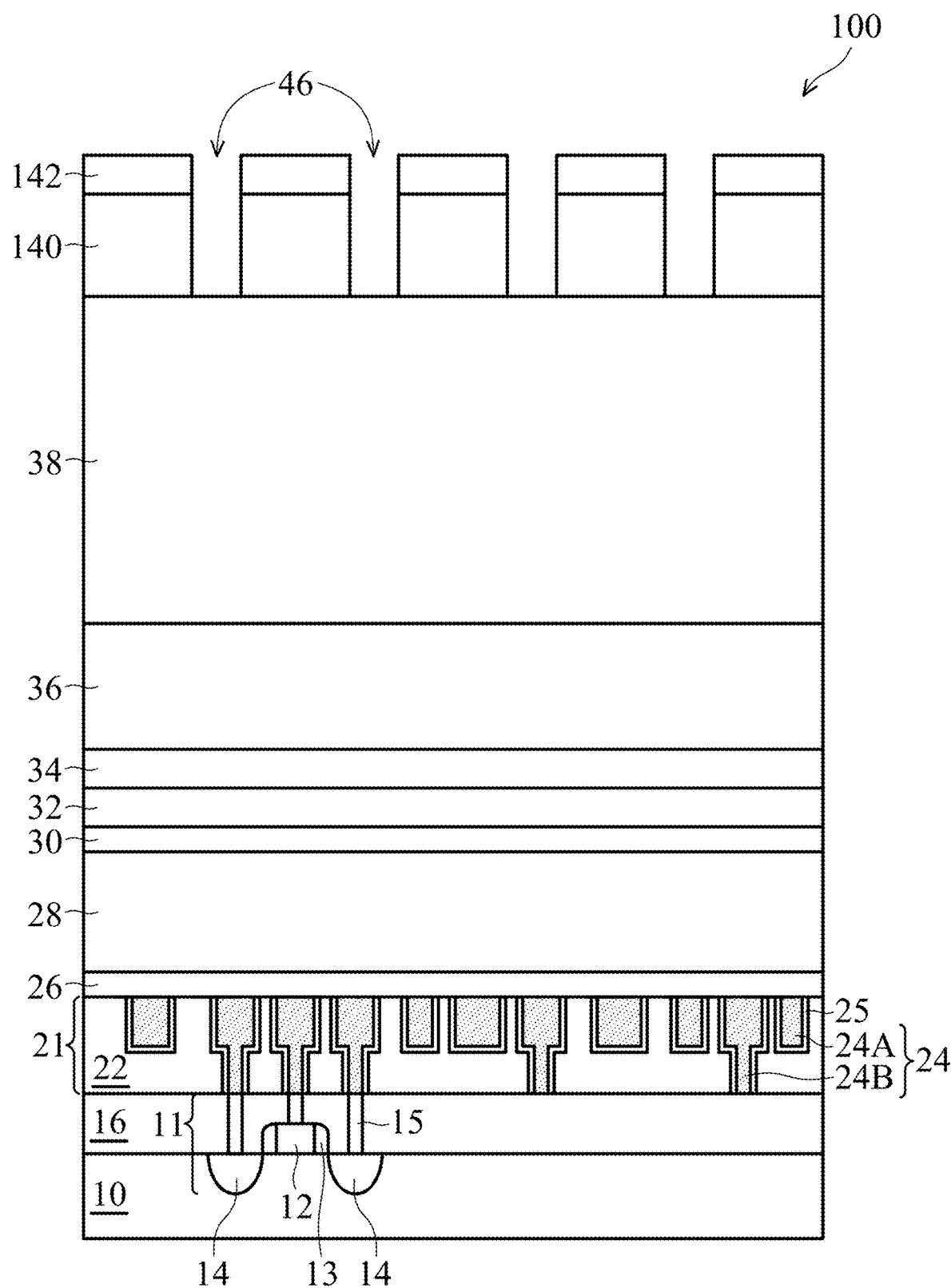

Next, referring to FIG. 3, middle layer 40 is etched to form patterned middle layer 140, which may also be referred to as middle layer 140. Middle layer 40 is etched using the patterned upper layer 142 (FIG. 2) as an etching mask, so that the pattern of patterned upper layer 142 is transferred to middle layer 40 to create patterned middle layer 140. During the patterning of middle layer 140, upper layer 142 may be partially, or entirely, consumed. Etching the middle layer 40 may result in openings 46 in the middle layer 140 which have been extended from openings 144. Any suitable etching technique may be used, such as a wet or dry etch using an etchant which is selective to the middle layer 140 material.

Figure 4:
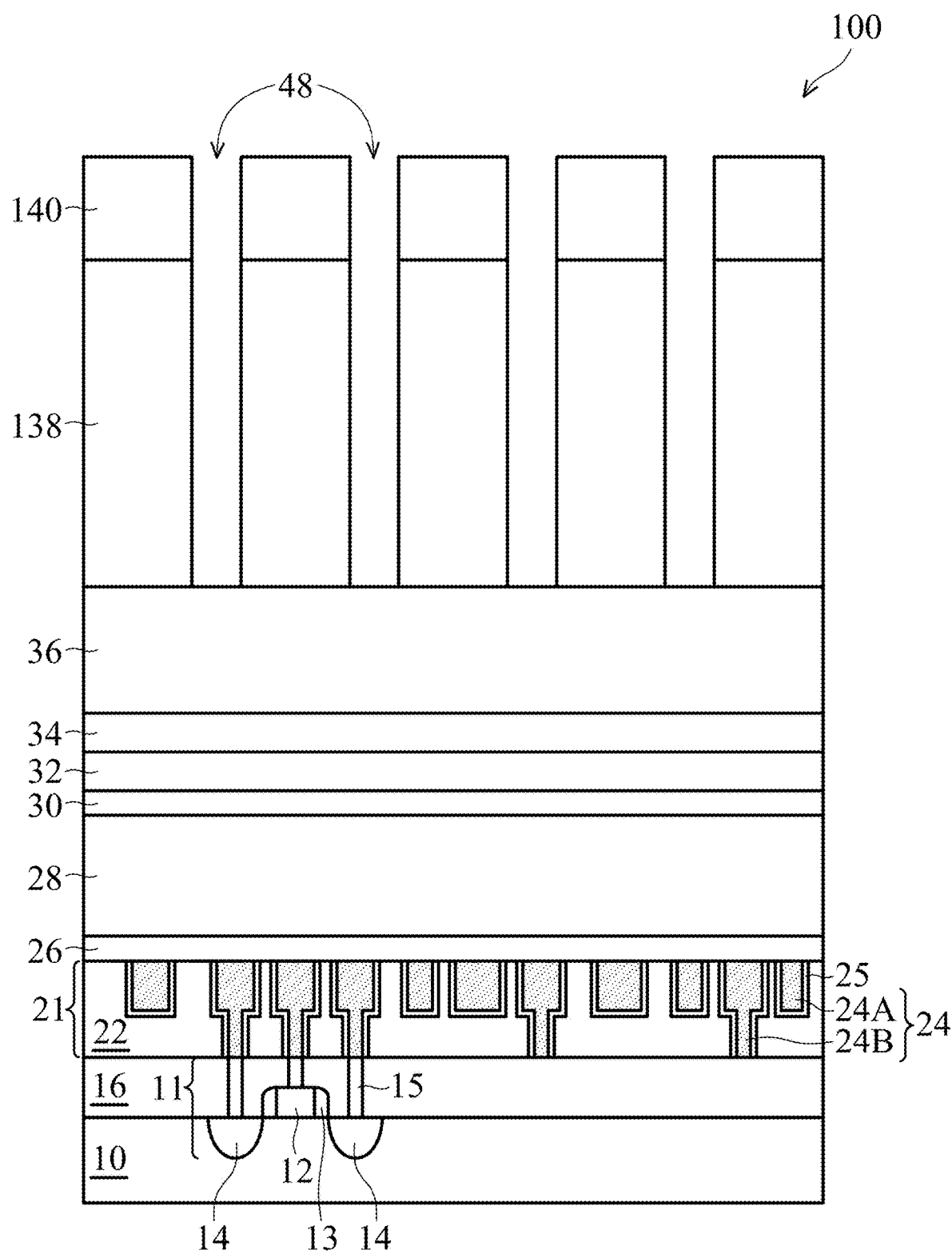

Turning to FIG. 4, the bottom layer 38 is then etched to form patterned bottom layer 138, which may also be referred to as bottom layer 138. Bottom layer 38 is etched using the middle layer 140 as an etching mask, so that the pattern of middle layer 140 is transferred to bottom layer 38 to create a patterned bottom layer 138. The bottom layer 138 has openings 48 which have been extended from openings 46 (FIG. 3). Upper layer 142 will be fully consumed during the patterning of bottom layer 38 if it has not been fully consumed in the patterning of middle layer 140. Openings 48 may be tapered or may have vertical sidewalls, within process variations. Any suitable etching technique may be used, such as a wet or dry etch using an etchant which is selective to the material of bottom layer 138. For example, in some embodiments the etchant may be 02 based or $N_2/H_2$ based etchant gas used in an etching chamber with other process gasses. Other suitable etchant gasses may be used. The bottom layer 38 etch process may be performed for an etch time $t_{BT}$ between about 20 sec and about 60 sec, such as about 35 sec, at a pressure between about 3 mTorr and about 45 mTorr, such as about 8 mTorr, a temperature between about 15° C. and about 65° C., such as about 30° C., with a bias voltage applied at a power between about 100 V and about 500 V, such as about 300 V. Other environmental conditions and etch times may be used.

Figure 5:
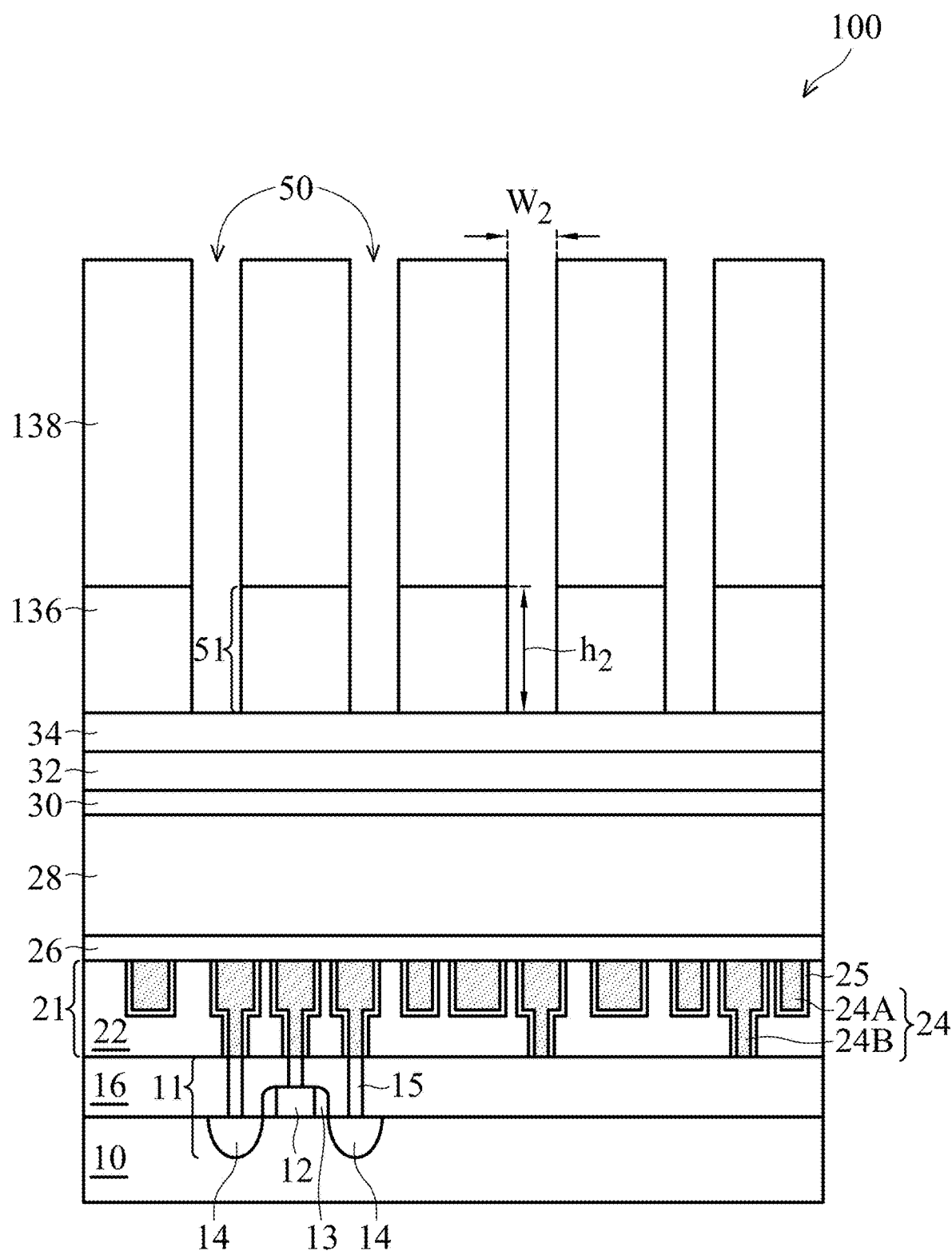

FIG. 5 illustrates an anisotropic etching of mandrel layer 36 of FIG. 4 to form patterned mandrel layer 136, which may also be referred to as mandrel layer 136. Mandrel layer 36 is etched using the patterned bottom layer 138 as an etching mask, so that the pattern of bottom layer 138 is transferred to mandrel layer 36 to create a patterned mandrel layer 136. The mandrel layer 136 has openings 50 which have been extended from openings 48 (FIG. 4). The etching technique may include a dry etch using a suitable etchant. In some embodiments, the etchant selected for etching the patterned mandrel layer 136 may be a fluorine free etchant, such as a chlorine based etchant. In other embodiments, other etchants may be used, including fluorine based etchants. Mask layer 34 under the patterned mandrel layer 136 may serve as an etch stop layer for the etching through of the mandrel layer 36. Openings 50 are formed as a result of the etching of the patterned mandrel layer 136. Openings 51 are the portions of the openings 50 in the patterned mandrel layer 136 which have a height $h_2$ and width $w_2$, where the height $h_2$ corresponds to the thickness of the layer 136 and the width $w_2$ corresponds to the width $w_1$, being approximately equal to the width $w_1$ or $w_1'$, within process variations. A resulting ratio of the height-to-width, $h_2:w_2$, may be about 0.8 to about 3.0, such as about 1.6.

The etch process illustrated by FIG. 5 may be performed for an etch time $t_{BT}$ between about 15 sec and about 150 sec, such as about 80 sec, at a pressure between about 3 mTorr and about 80 mTorr, such as about 20 mTorr, and a temperature between about 25° C. and about 70° C., such as about 40° C. Other environmental conditions and etch times may be used.

Figure 6:
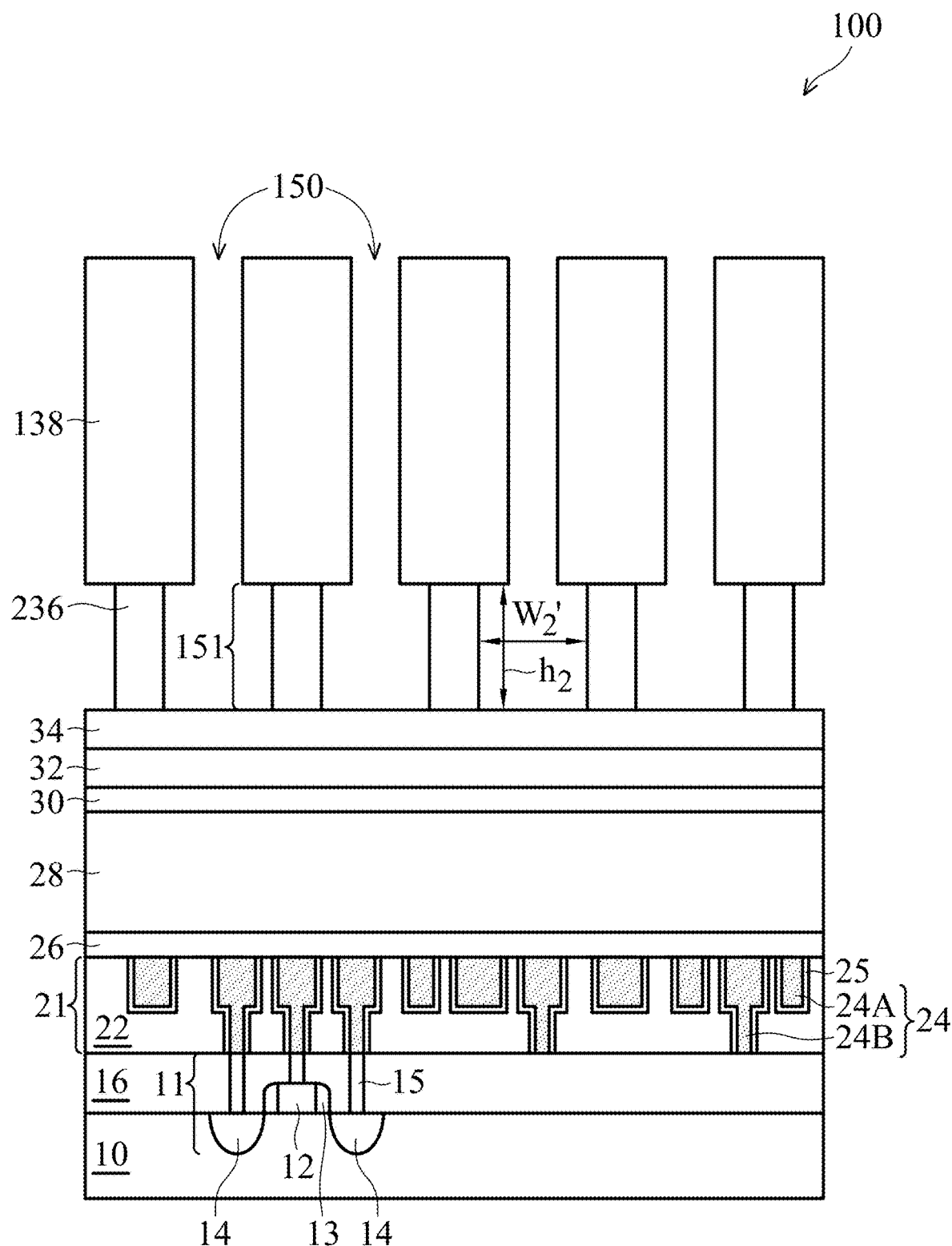

FIG. 6 illustrates device 100 following a further etch of the patterned mandrel layer 136 to increase the width of the openings 50 in the patterned mandrel layer 136 and produce patterned mandrel layer 236. The openings 150 includes the entire opening through the remaining layers (i.e., patterned mandrel layer 236 and bottom layer 138). The openings 151 includes the portion of the openings 150 that are in the patterned mandrel layer 236. The further etch of the patterned mandrel layer 236 may be performed by wet etch using a suitable etchant selective to the material (e.g., amorphous silicon) of the patterned mandrel layer 236. The bottom layer 138 can protect the top portion of the patterned mandrel layer 236 such that the openings are widened without significantly altering the pattern of the patterned mandrel layer 236. In some embodiments, the resulting patterned mandrel layer 236 may have an inverted taper (the openings 151 being wider at the bottom than the top), depending on the etching techniques and conditions. See FIG. 6A. In some embodiments, the resulting patterned mandrel layer 236 may have an hourglass shape, depending on the etching techniques and conditions. See FIG. 6B.

Figure 6A:
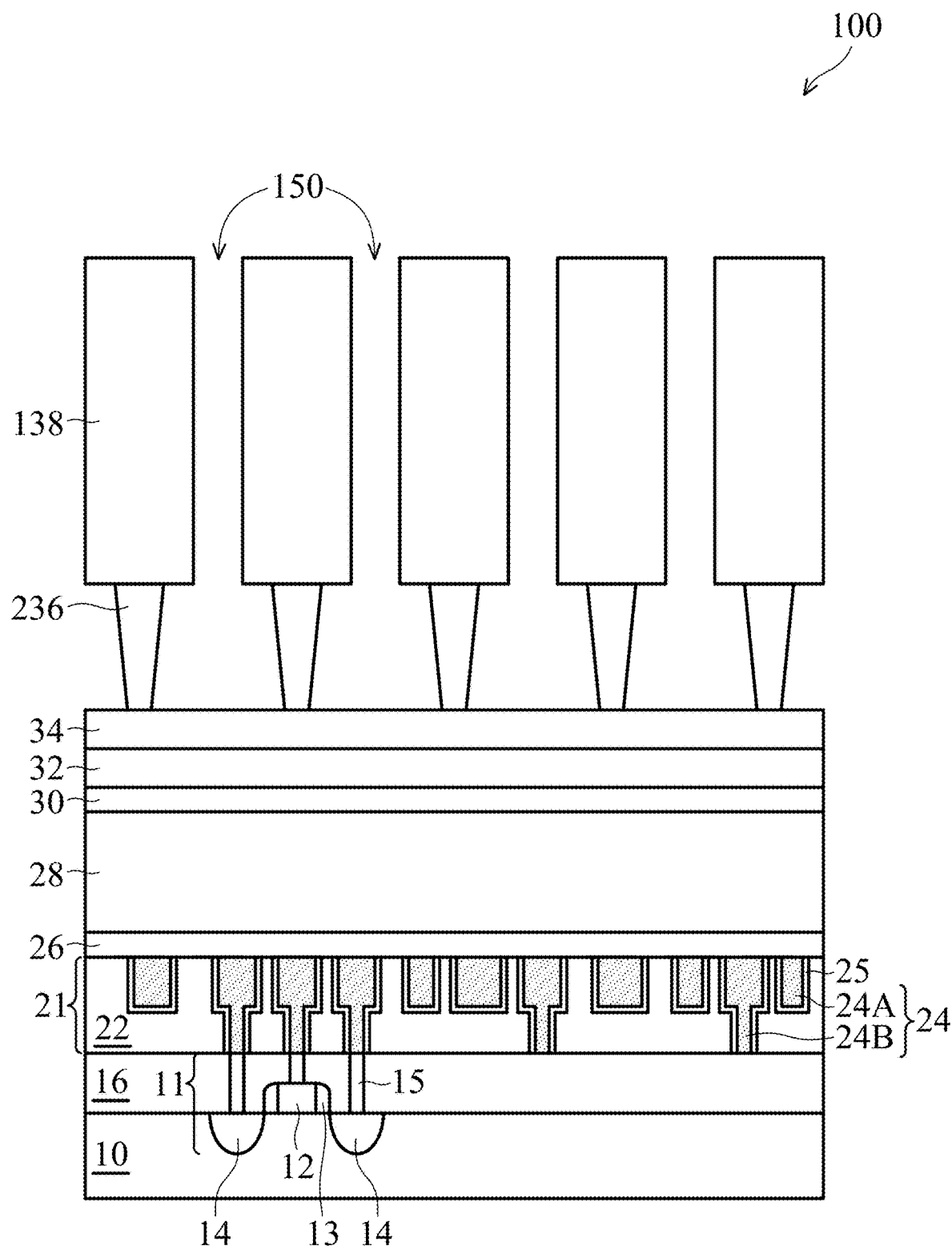
Figure 6B:
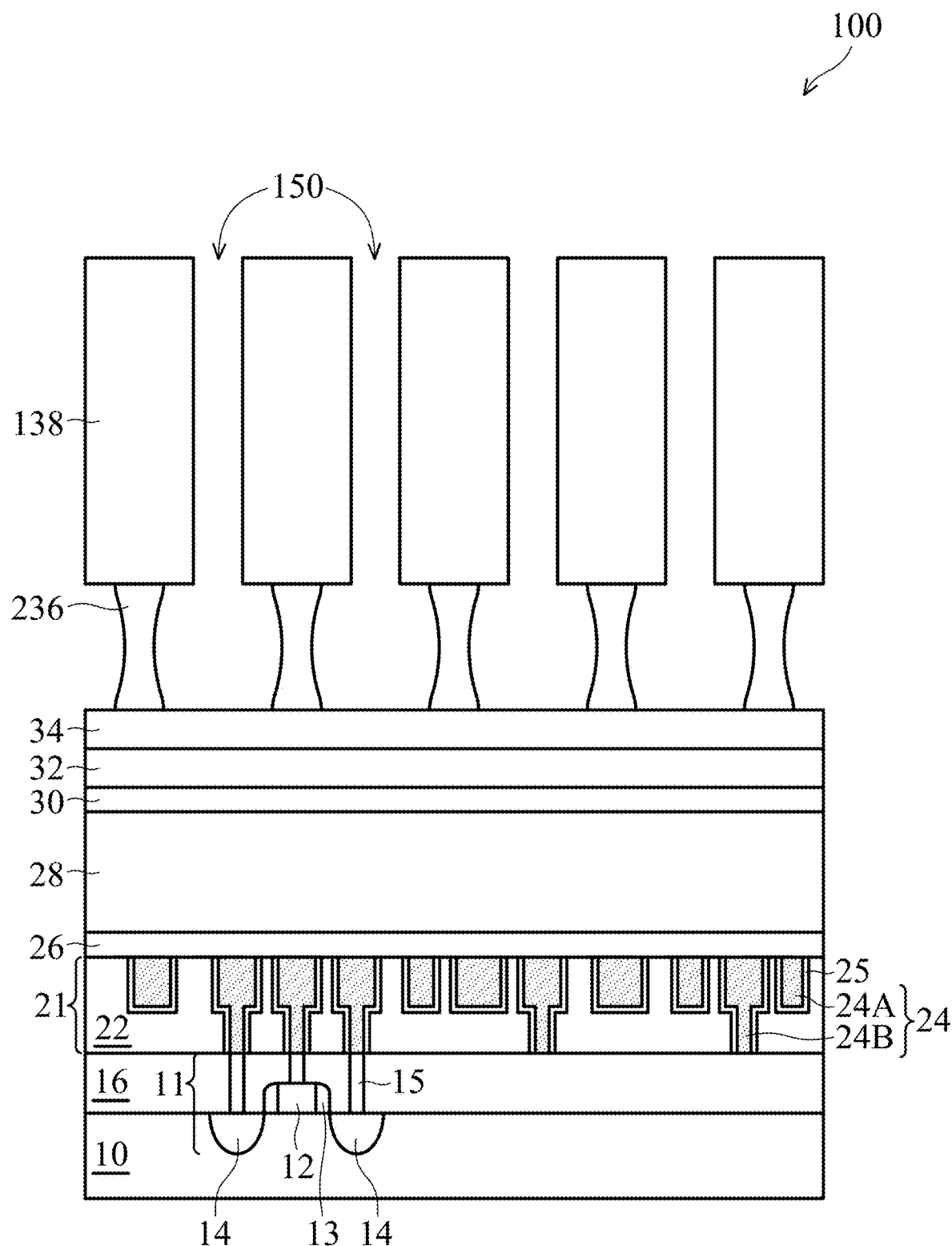

Embodiments consistent with those depicted in FIGS. 6A and 6B are otherwise identical to FIG. 6. The new width $w_2'$ of the openings 151 may be between about 200 and 550 Å, such as about 400 Å.

As a result of the etch widening the opening 151, the height-to-width ratio may be reduced from the height-to-width ratio $h_2:w_2$ to the height-to-width ratio $h_2:w_2'$. The height-to-width ratio $h_2:w_2'$ may be between about 0.6 and 2.5, such as about 1.3. Because the height-to-width aspect ratio has been reduced in the bottom mask layer 238, the wiggle in the lines that will result in the subsequent etching of the target layer 28 is reduced, discussed below with respect to FIG. 11. In some embodiments, each of the etchings described above with respect to FIGS. 1-6B can be performed in the same etching chamber without removing the device 100 between intermediate steps.

Figure 7:
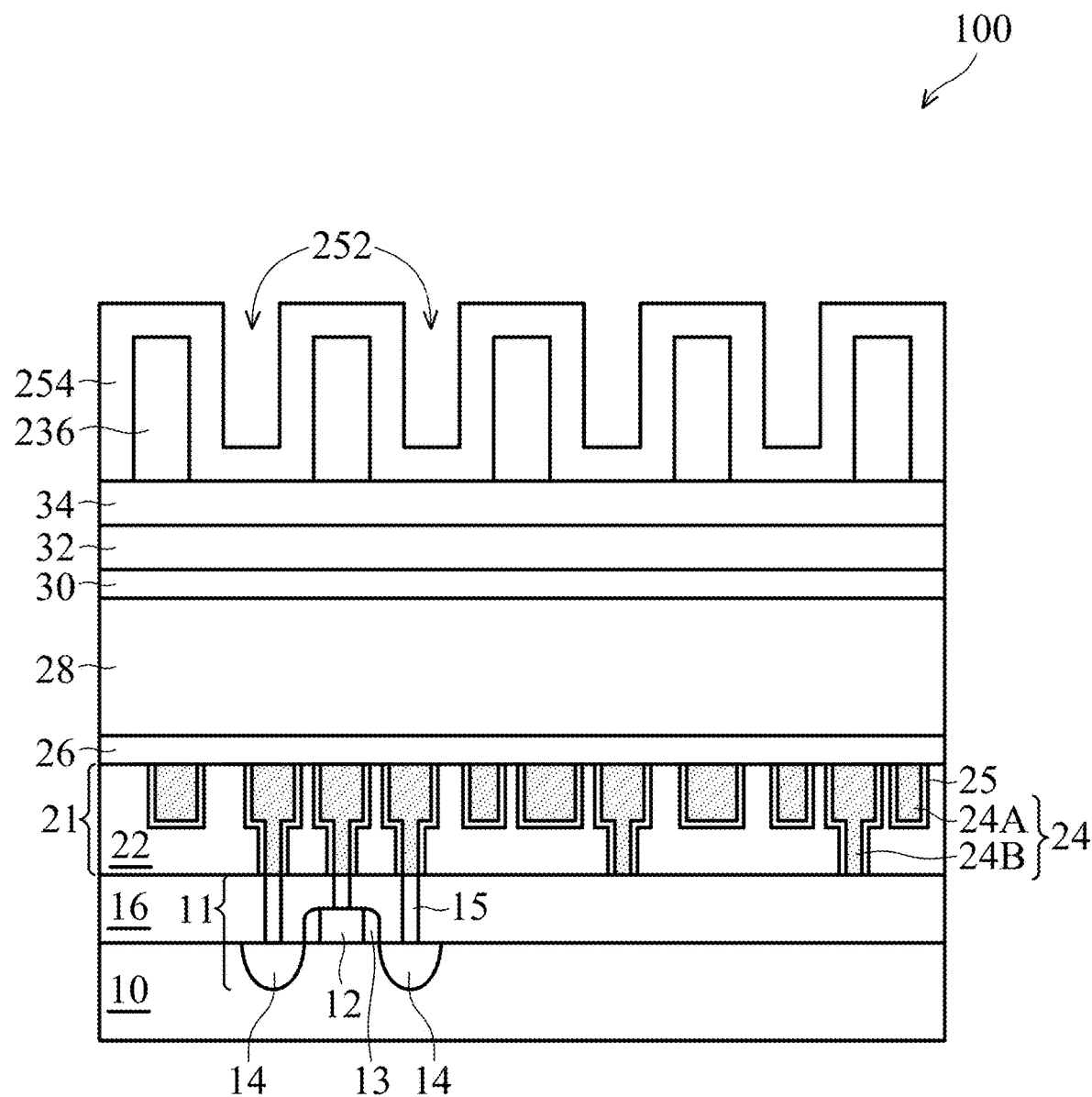

Referring to FIG. 7, following the etching of the patterned mandrel layer 236, the bottom layer 138 may be removed by an ashing process. In a SADP process a spacer material 254 may be deposited over the patterned mandrel layer 236. The spacer material may be a suitable oxide or nitride insulating or dielectric material which is deposited using a deposition technique suitable to form a substantially conformal layer (for example, such that the horizontal portions and vertical portions of the spacer layer 254 vary by 25% or less). Such deposition techniques may include, for example, PECVD, HDPCVD, ALD, CVD, LPCVD, PVD, and the like.

Figure 8:
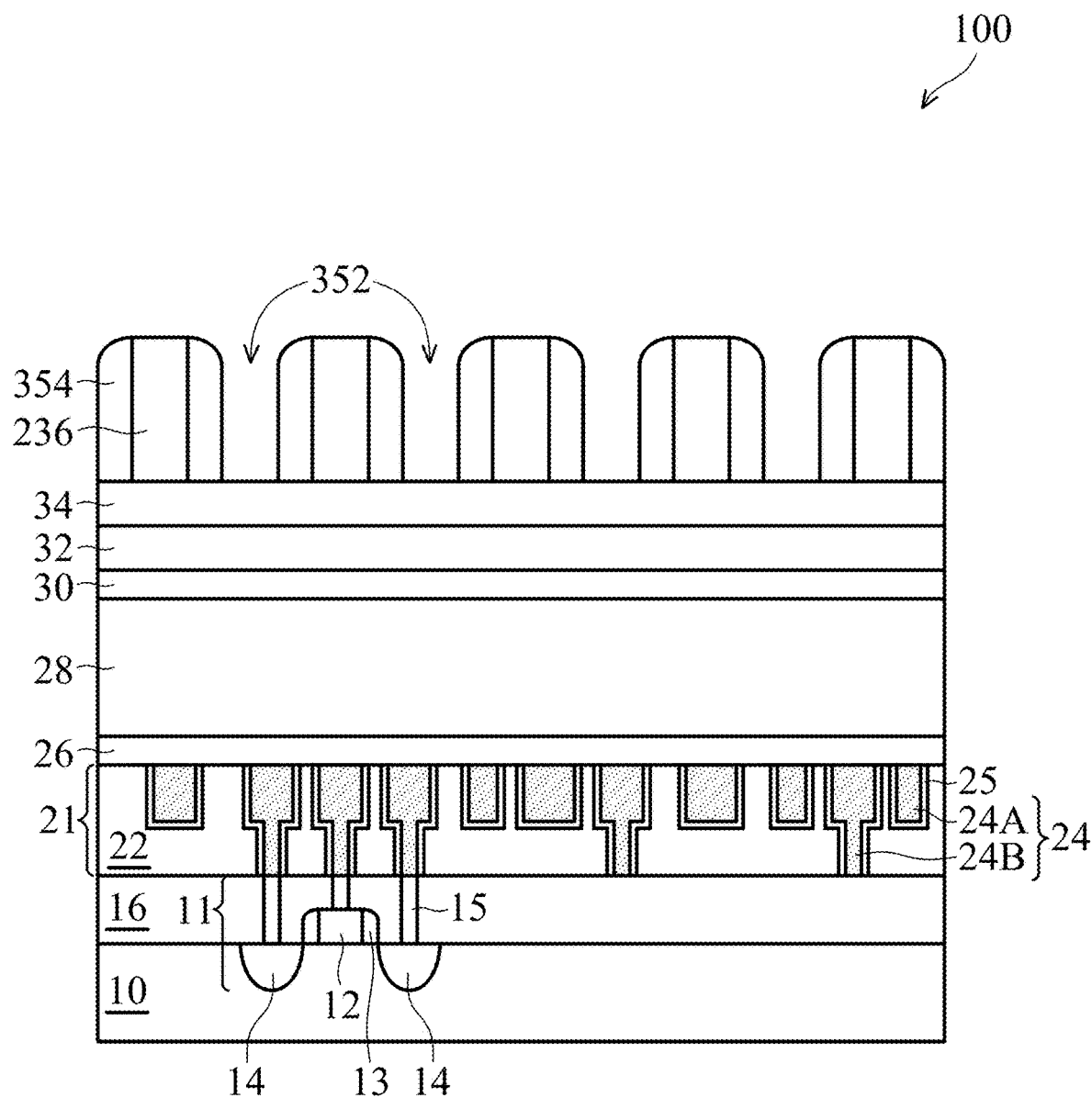

Next, as illustrated in FIG. 8, the spacer layer 254 may be anisotropically etched using a suitable technique to remove horizontal portions of the spacer material, resulting in self-aligned spacer mask 354. The openings 252 represent the openings between mandrels to be etched. In some embodiments, the width of the openings 252 may be between about 80 and 250 Å, such as about 150 Å.

Figure 9:
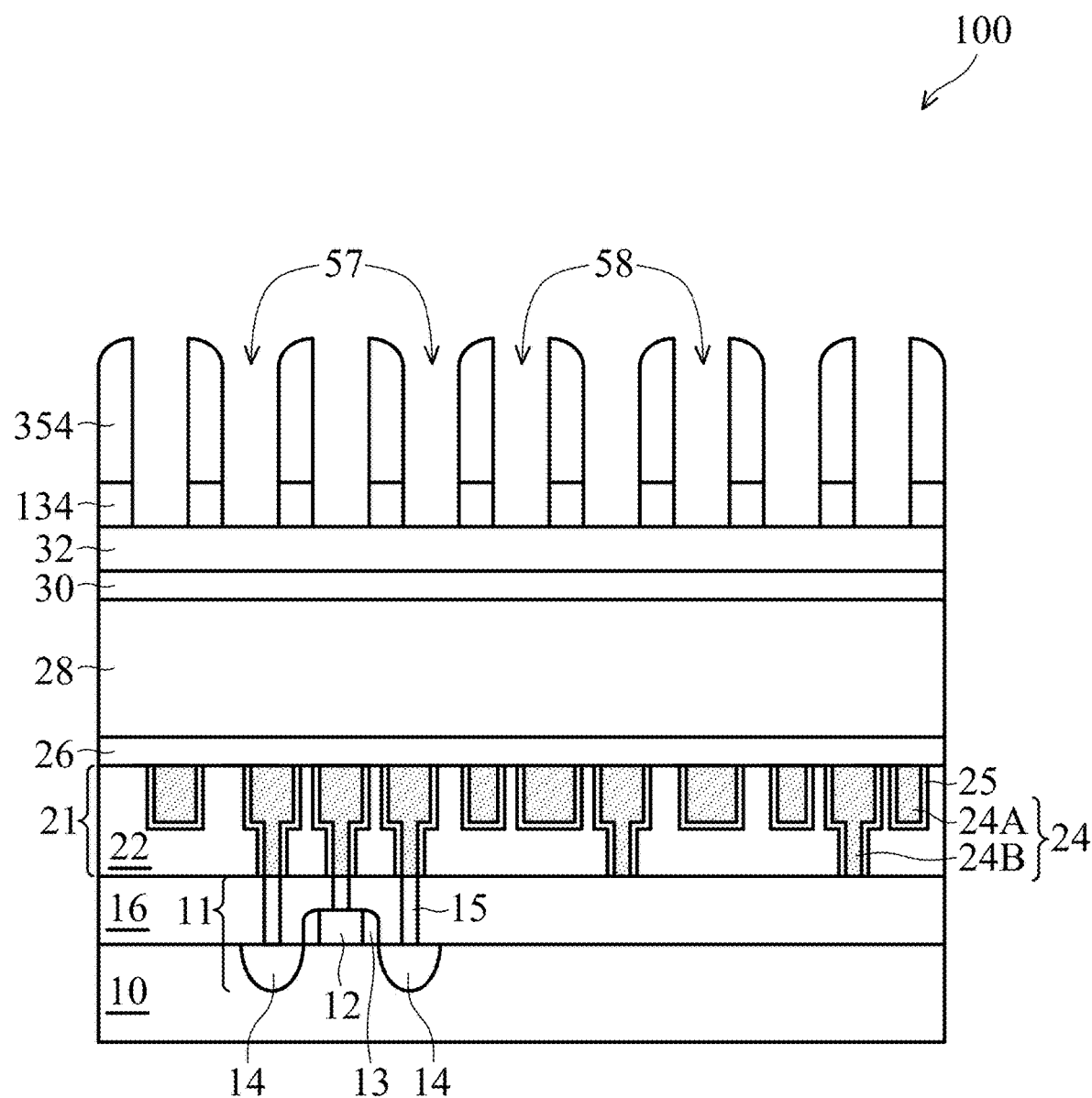

Next, as illustrated in FIG. 9, the mandrels in patterned mandrel layer 236 may be removed to create further openings (such as openings 58) between the spacers of spacer mask 354. Next, mask layer 34 is etched using the self-aligned spacer mask 354 as an etching mask, so that the pattern of self-aligned spacer mask 354 is transferred to mask layer 34 to create a patterned mask layer 134, which may also be referred to as mask layer 134. The patterned mask layer 134 has openings 57 which have been extended from openings 352 and openings 58 which have been extended from the openings resulting from the removal of the patterned mandrels 236. The etching of patterned mask layer 134 may be performed by any suitable technique, such as by a wet or dry etch selective to the material of mask 34. In some embodiments, the etching of patterned mask layer 134 may consume the self-aligned spacer mask 354.

Figure 10:
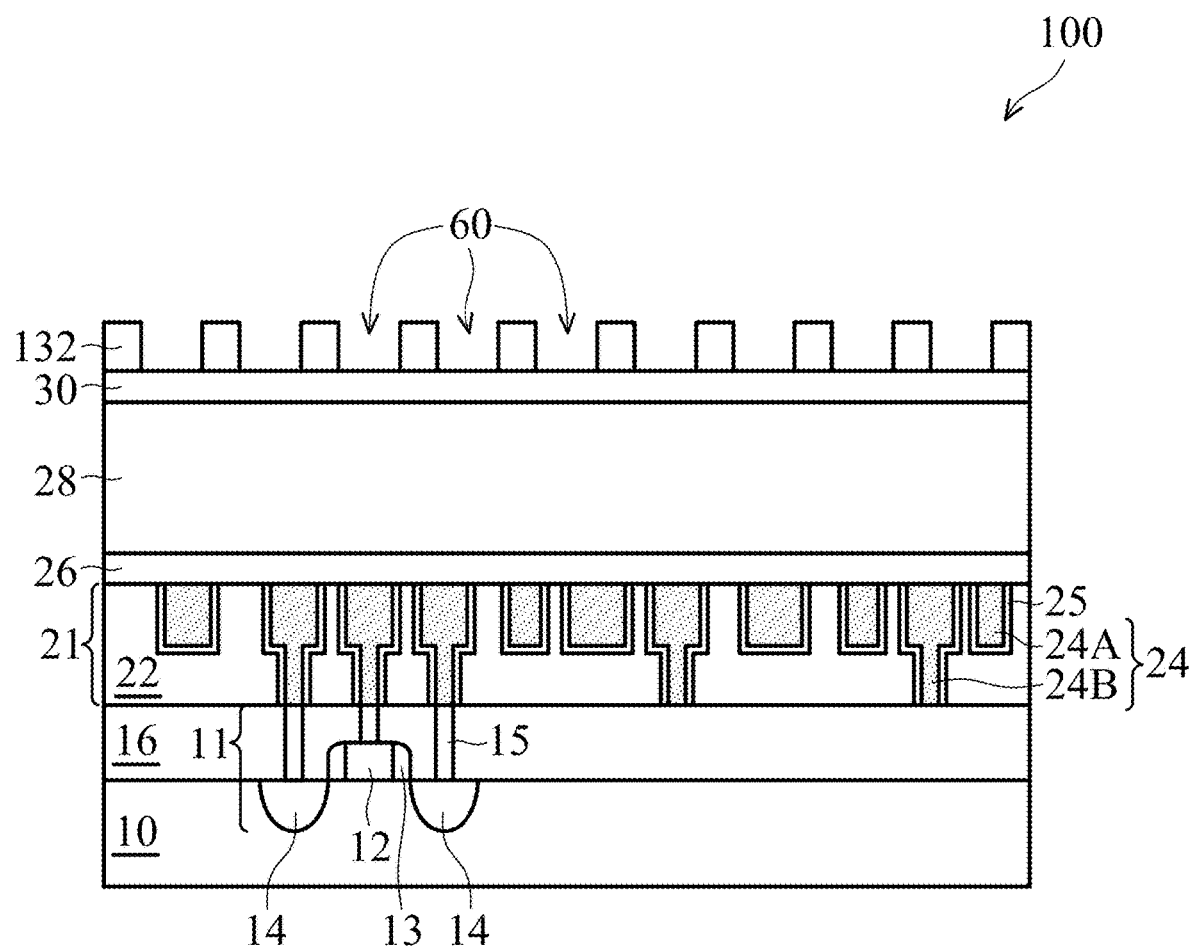

Referring to FIG. 10, following the etching of the mask layer 134, mask layer 134 is used to pattern mask layer 32 to form patterned mask layer 132. Mask layer 32 is etched using the patterned mask layer 134 as an etching mask, so that the pattern of mask layer 134 is transferred to mask layer 32 to form patterned mask layer 132. Patterned mask layer 132 has openings 60 which have been extended from openings 57 and 58. The etchant and etching technique used can be selective to the material of patterned mask layer 132.

Figure 11:
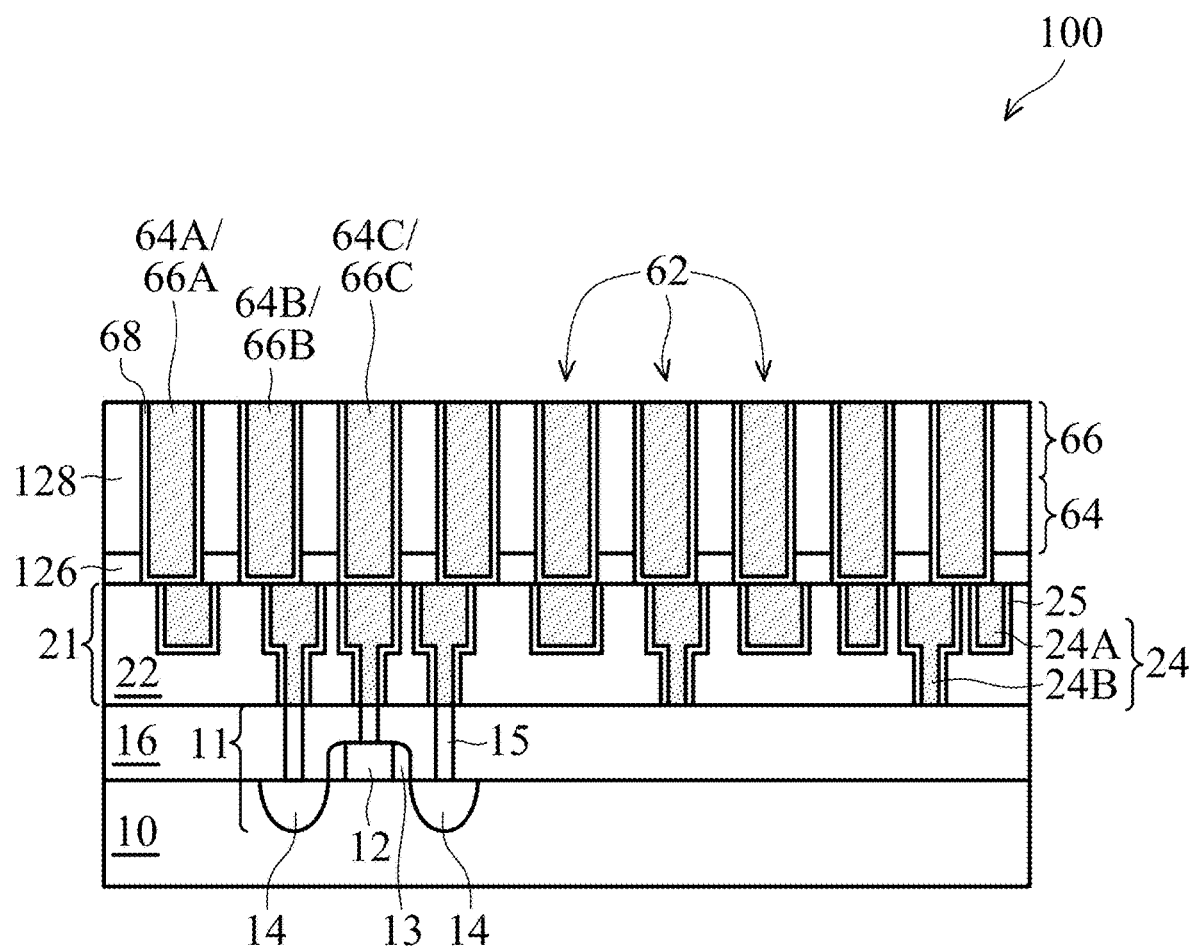

In FIG. 11, the patterned mask layer 132 is used as an etching mask to progressively transfer the pattern of patterned mask layer 132 to the underlying mask 30, low-k dielectric target layer 28, and etch stop layer 26 by etching each layer in turn, using one or more of the previous layers as a mask. Openings 62 are formed by extending openings 60 into the underlying layers corresponding to openings to be filled with metal lines and vias. In some embodiments, prior to using mask 132 as a mask in etching the underlying layers, the remaining portions of patterned mask layer 134 may be removed by a separate process. In some embodiments, the remaining portions of patterned mask layer 134 may be removed simultaneously with etching mask 30. The patterned target layer 128 and patterned etch stop layer 126 may be etched using a suitable etching technique such as a wet or dry etch using an appropriate etchant which is selective to the respective materials to be etched. In particular, target layer 128 may be etched using a plasma or RIE anisotropic etch using etch stop layer 26 as an etch stop so that the widths of the resulting trenches are relatively uniform within process variations. Then, in a subsequent process, etch stop layer 26 (e.g., 26A and 26B) may be etched using the target layer 128, patterned hard mask 30, or metal hard mask 132 as a mask to expose the metal features 24. The openings formed in the target layer 128 may include trenches and/or vias. For example, vias may reach the exposed metal features 24, while trenches may be formed to have a bottom which is between the topmost surface of the target layer 128 and the bottommost surface of the target layer 128.

As a result of the lower aspect ratio of the top layer 142 of the tri-layer and subsequent widening of the openings 151 in the patterned mandrel layer 236, the patterned mandrel layer 236 forms mandrels with substantially straight (non-wiggly) sidewalls, in a top down view, which result in a self-aligned spacer mask 354 which also have substantially straight sidewalls as well as the subsequent openings formed therein.

FIG. 11 also illustrates the formation of conductive vias 64A, 64B, and 64C (collectively referred to as vias 64) in openings in the target layer 28 (of FIG. 10). Conductive lines 66A, 66B, and 66C (collectively referred to as lines 66) are also formed in the trenches of target layer 28. Vias 64 and conductive lines 66 may include conductive liners 68, which may be diffusion barrier layers, adhesion layers, and/or the like. Liners 68 may be formed of titanium, titanium nitride, tantalum, tantalum nitride, or other alternatives. The inner regions of conductive lines 66 and vias 64 include a conductive material such as copper, a copper alloy, silver, gold, tungsten, aluminum, or the like. In accordance with some embodiments, the formation of vias 64 and conductive lines 66 includes performing a blanket deposition to form liner 68, depositing a thin seed layer of copper or copper alloy over the liner, and filling the rest of the openings with metallic material, for example, through electro-plating, electro-less plating, deposition, or the like. A planarization such as Chemical Mechanical Planarization (CMP) is then performed to level the surface of conductive lines 66, and to remove excess conductive materials from the top surface of dielectric layer 128. Mask layer 30 (FIG. 10) may be removed in the planarization or etched after the planarization. The cross-sectional view of FIG. 11 may be, for example, along the line A-A of FIG. 22.

In subsequent steps, an additional etch stop layer (not shown) may be formed, and more low-k dielectric layers, metal lines, and vias (not shown) may be formed over the additional etch stop layer. The process steps and resulting structures may be similar to what are shown in FIGS. 1 through 11.

FIGS. 12 through 21 illustrate cross-sectional views of intermediate stages in the formation of features in a target layer in accordance with some embodiments using a double patterning process. It should be understood that the process described in these steps can be altered to use a triple, quadruple, etc. patterning process. Likewise, it should be understood that the process described in these steps can be used in a single patterning process. The process described is a double patterning double etching (2P2E) process, however, it should be understood that it can be readily modified to include a double patterning single etching technique (2P1E) and other similar techniques, e.g. 3P3E, 3P1E, etc. These techniques are considered to be within the scope of this disclosure.

Figure 12:
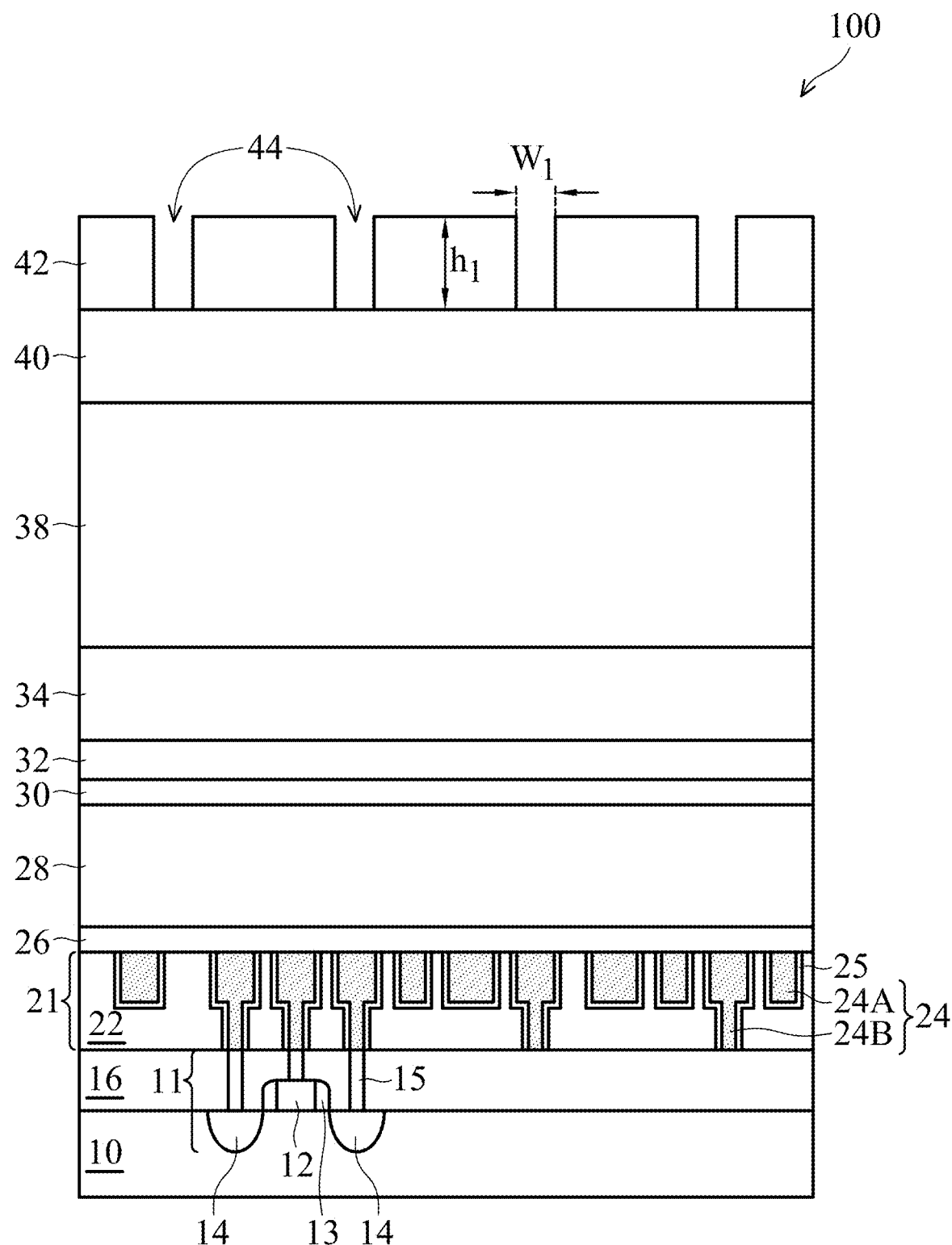
FIGS. 12 through 21 illustrate an intermediate step of a double patterning method of forming a metal line having a reduced wiggle, in accordance with some embodiments.

FIG. 12 illustrates an intermediate step in the production of a semiconductor device 100. The layers included correspond to the layers discussed above with respect to FIG. 1. It should be noted that the structure illustrated in FIG. 12 does not include a mandrel layer (mandrel layer 36 of FIG. 1), but in some embodiments, a similar layer made of the same or similar materials (e.g., amorphous silicon) is included as the mask layer used in the double patterning technique. In some embodiments, such as in the description that follows, mask layer 34 serves as the mask layer which will be double patterned for patterning lines in target layer 28.

After the upper layer 42 is formed, upper layer 42 is patterned as illustrated in FIG. 12 using an acceptable photolithography technique. The patterned upper layer 42 includes openings 44 therein. In a top view of device 100, openings 44 may have shapes such as strips, round vias, or conductive patterns. Each of the openings 44 has a height-to-width ratio, $h_1:w_1$. In some embodiments, the height $h_1$ of the openings 44 corresponds to the thickness of the top layer 42 and the width $w_1$ of the openings 44 depends on the photolithography technique used to pattern the top layer 42. The width $w_1$ of the openings 44 may be between about 180 and 450 Å, such as about 300 Å. Other widths for the openings 44 can be used.

Figure 13:
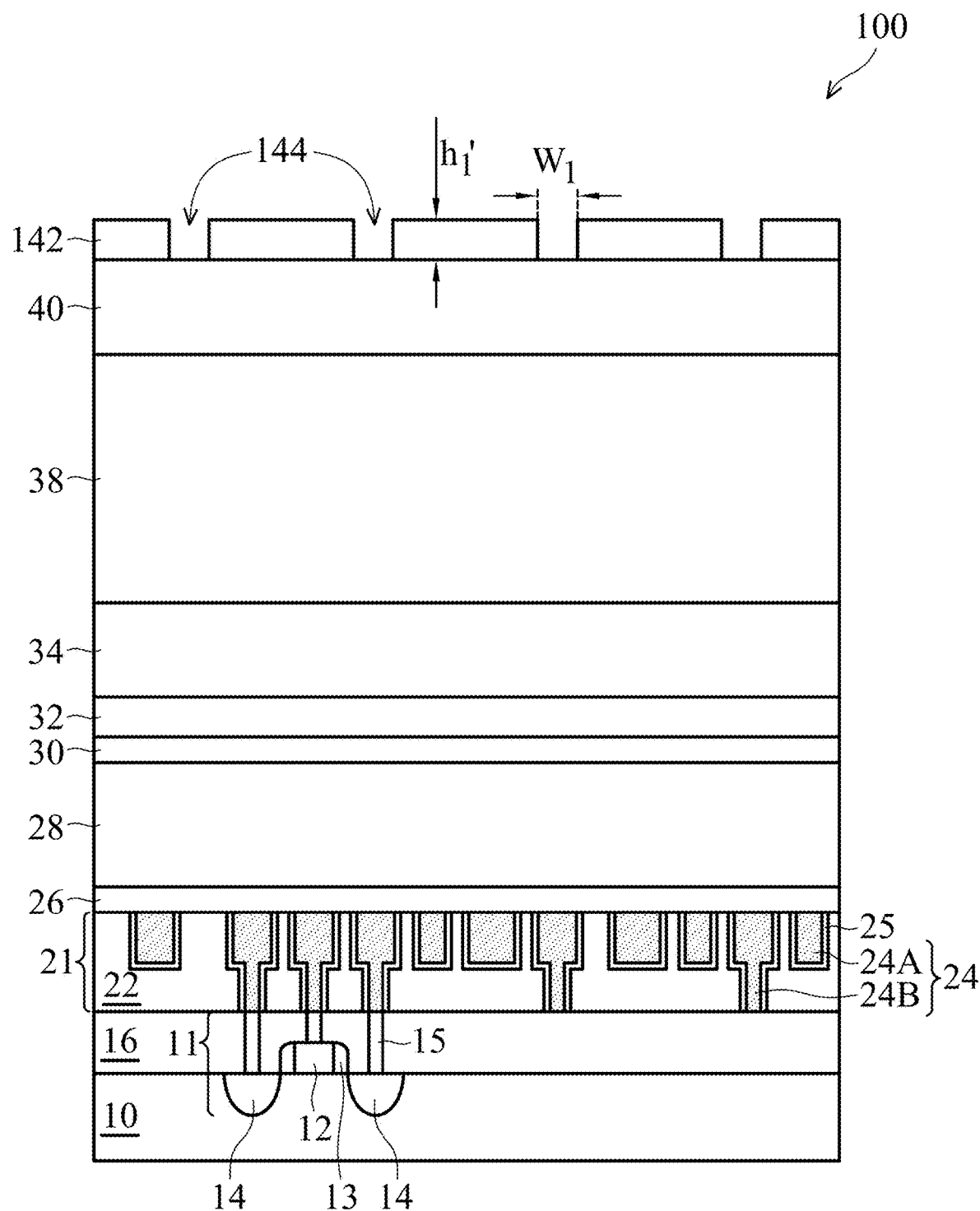

Next, referring to FIG. 13, in order to reduce the height-to-width ratio of the openings 44, the thickness of the upper layer 42 (and corresponding height $h_1$ of the openings 44 of FIG. 12) is reduced to a height $h_1'$. Techniques may correspond to those discussed above with respect to FIG. 2. The reduced height-to-width ratio, $h_1':w_1$, may be between about 0.5 and 2.0, such as about 1.0. In some embodiments, the width $w_1$ may be changed to a width $w_1'$, for example, if the openings 44 of FIG. 12 are widened in the same process which reduces the height of the upper layer 42. In such embodiments, the resulting height-to-width ratio $h_1':w_1'$ may be reduced over the ratio $h_1:w_1$ by an even greater extent.

Figure 14:
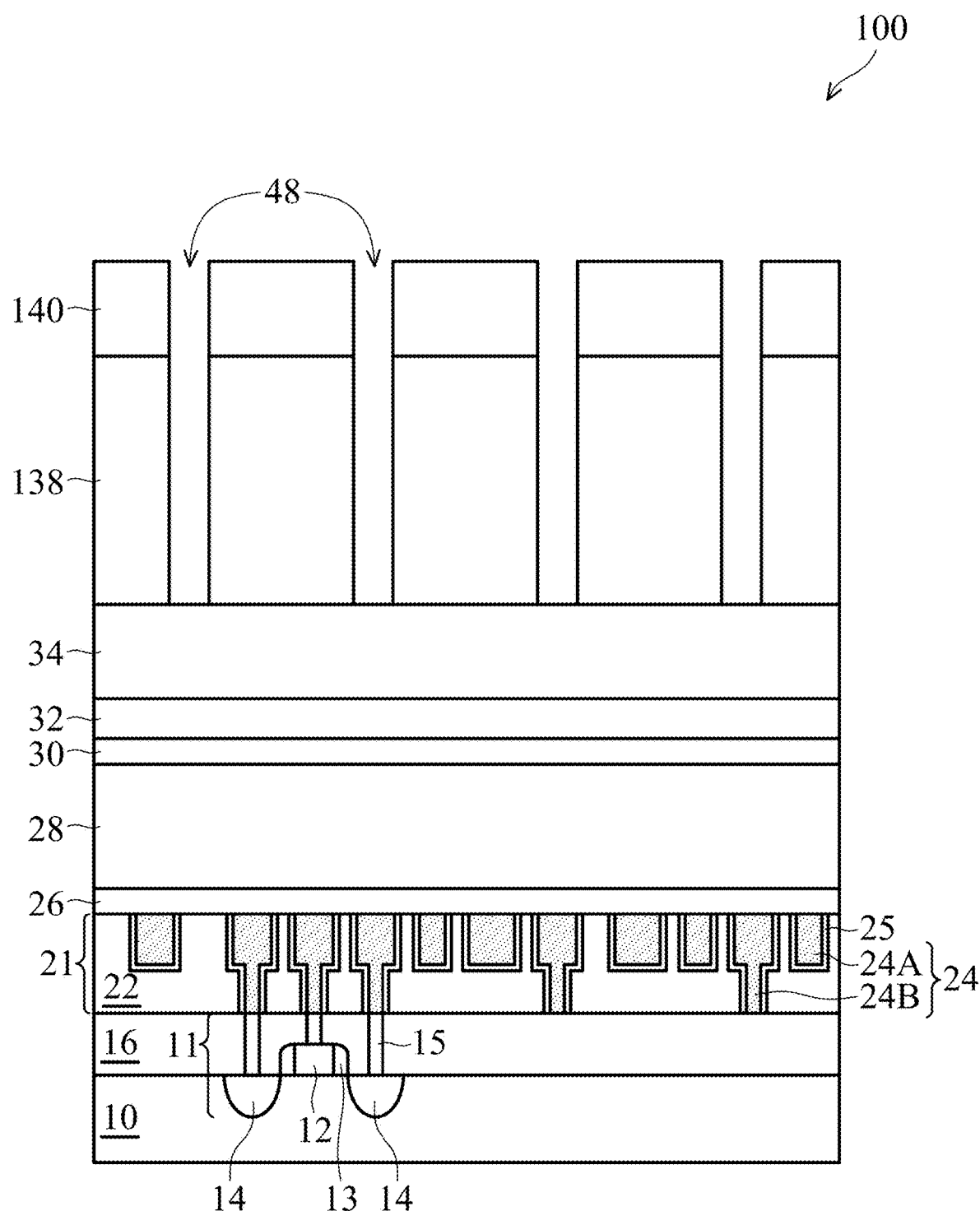

Next, referring to FIG. 14, middle layer 40 is etched to form patterned middle layer 140, which may also be referred to as middle layer 140. Middle layer 40 is etched using the patterned upper layer 142 (FIG. 13) as an etching mask, so that the pattern of upper layer 142 is transferred to middle layer 40 to create patterned middle layer 140. During the patterning of middle layer 140, upper layer 142 may be partially, or entirely, consumed. Etching the middle layer 40 may result in openings in the middle layer 140 which have been extended from openings 144. Any suitable etching technique may be used, such as a wet or dry etch using an etchant which is selective to the middle layer 140 material.

Next, the bottom layer 38 is then etched to form patterned bottom layer 138, which may also be referred to as bottom layer 138. Bottom layer 38 is etched using the middle layer 140 as an etching mask, so that the pattern of middle layer 140 is transferred to bottom layer 38 to create a patterned bottom layer 138. The bottom layer 138 has openings 48 which have been extended from openings 144 (FIG. 13). Upper layer 142 will also be fully consumed during the patterning of bottom layer 38 if it has not been fully consumed in the patterning of middle layer 140. The patterning of bottom layer 38 results in patterned bottom layer 138. Openings 48 may be tapered or may have vertical sidewalls, within process variations. Etching techniques and conditions may include those discussed above with respect to FIG. 4 and are not repeated.

Figure 15:
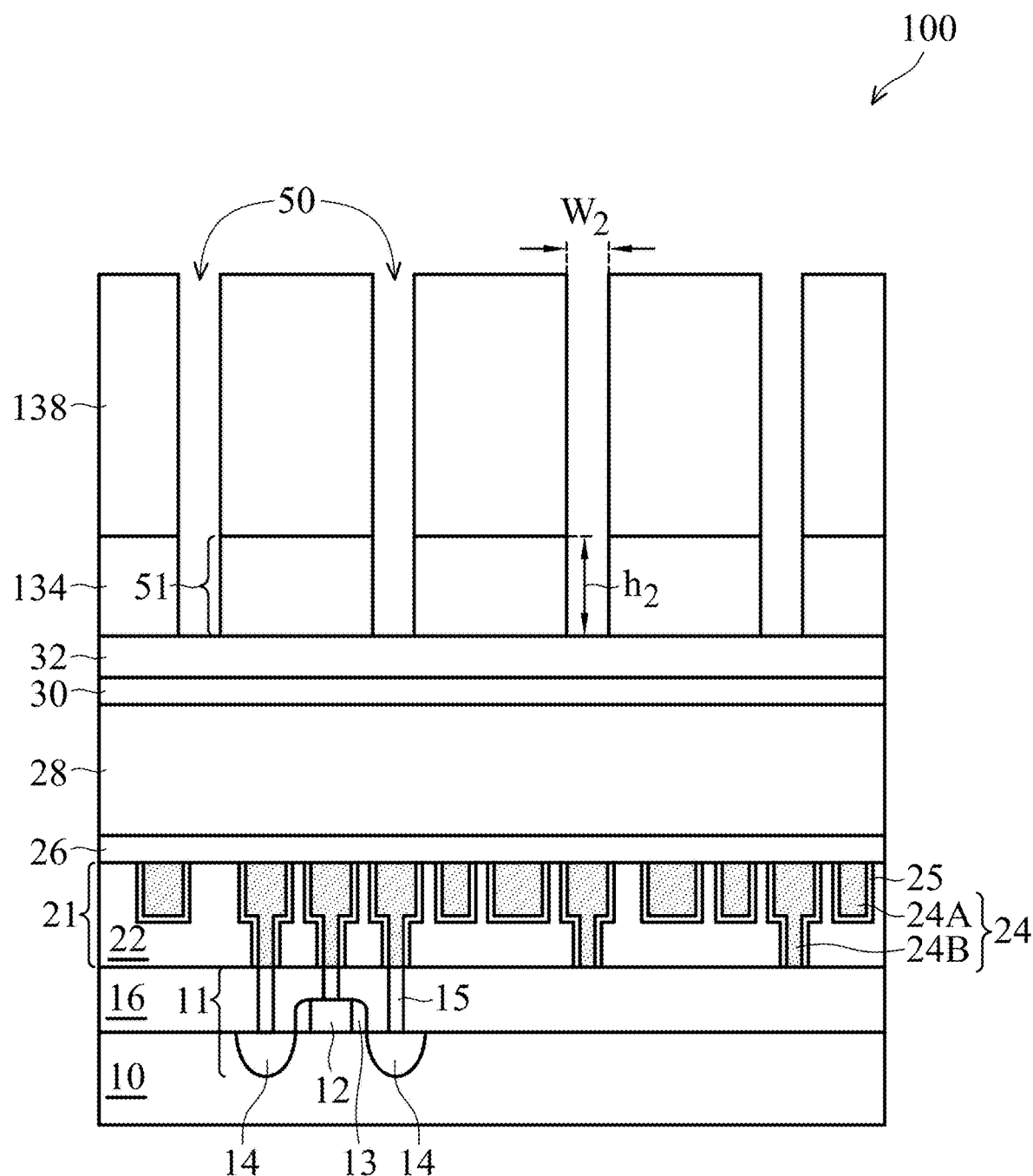

FIG. 15 illustrates an anisotropic etching of mask layer 34 of FIG. 14 to form patterned mask layer 134, which may also be referred to as mask layer 134. Mask layer 34 is etched using the patterned bottom layer 138 as an etching mask, so that the pattern of bottom layer 138 is transferred to mask layer 34 to create a patterned mask layer 134. The mask layer 134 has openings 50 which have been extended from openings 48 (FIG. 14). The etching technique may include a dry etch using a suitable etchant. Mask layer 32 under the patterned mask layer 134 may serve as an etch stop layer for the etching through of the material of patterned mask layer 134. Openings 51 are a portion of the openings 50 in the patterned mask layer 134 which have a height $h_2$ and width $w_2$, where the height $h_2$ corresponds to the thickness of the patterned mask layer 134 and the width $w_2$ corresponds to the width $w_1$, being approximately equal to the width $w_1$ or $w_1'$, within process variations. A resulting ratio of the height-to-width, $h_2:w_2$, may be about 0.8 to about 3.0, such as about 1.6.

Figure 15A:
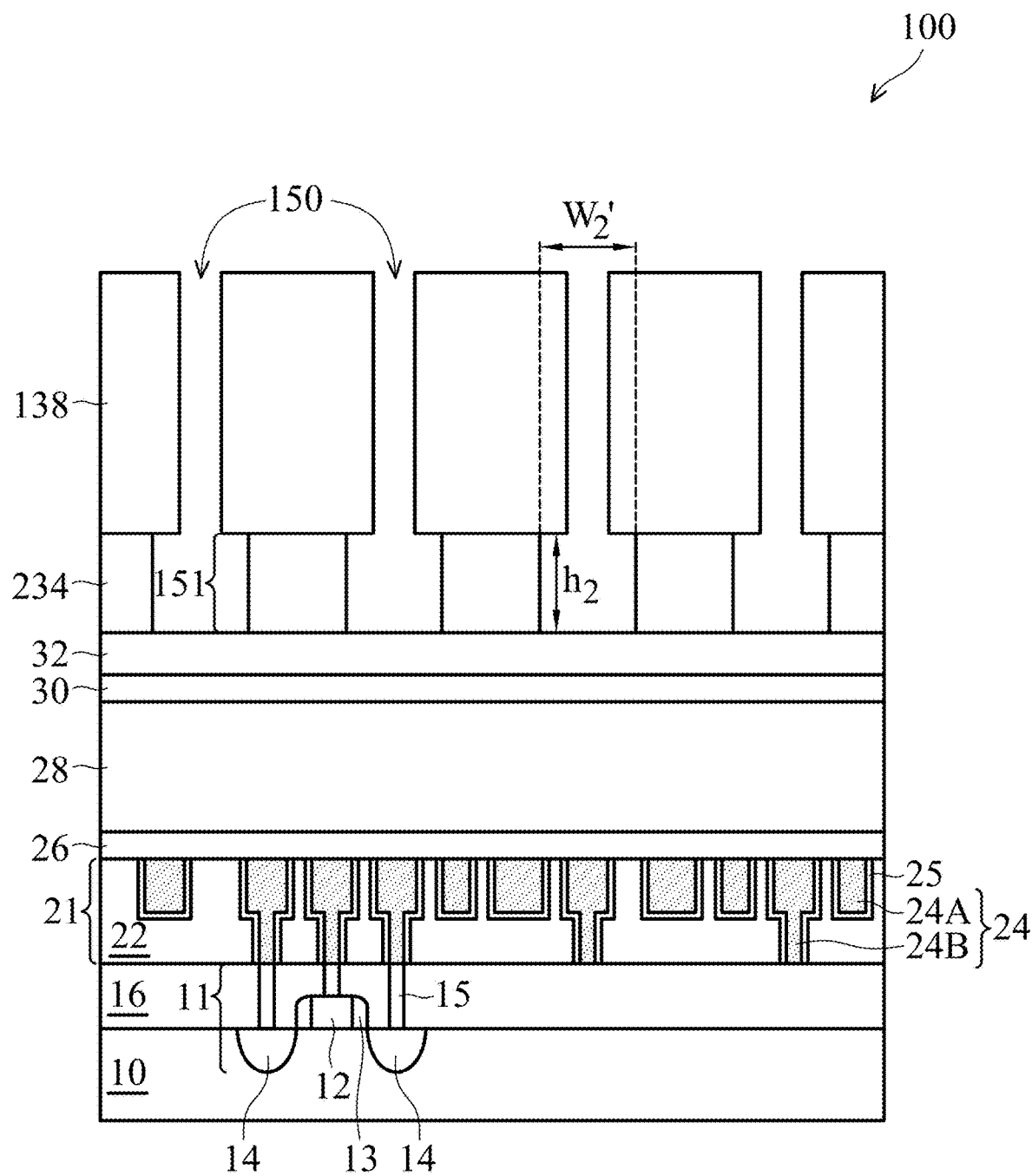

Referring to FIG. 15A, in some embodiments, the openings 51 may be widened into the openings 151 by etching the mask layer 134 into the modified mask layer 234 which may also be referred to as mask layer 234. The openings 151 may be widened to have a width $w_2'$ to reduce the height-to-width ratio from $h_2:w_2$ to $h_2:w_2'$.

The etching of mask layer 34 of FIG. 15 or FIG. 15A is a first patterning and etching of the mask layer 134 or 234. A second patterning of the mask layer 134 or 234 may also be performed. In some embodiments, each of the etching processes described above with respect to FIGS. 12-15 can be performed in the same etching chamber without removing the device 100 between intermediate steps.

Figure 16:
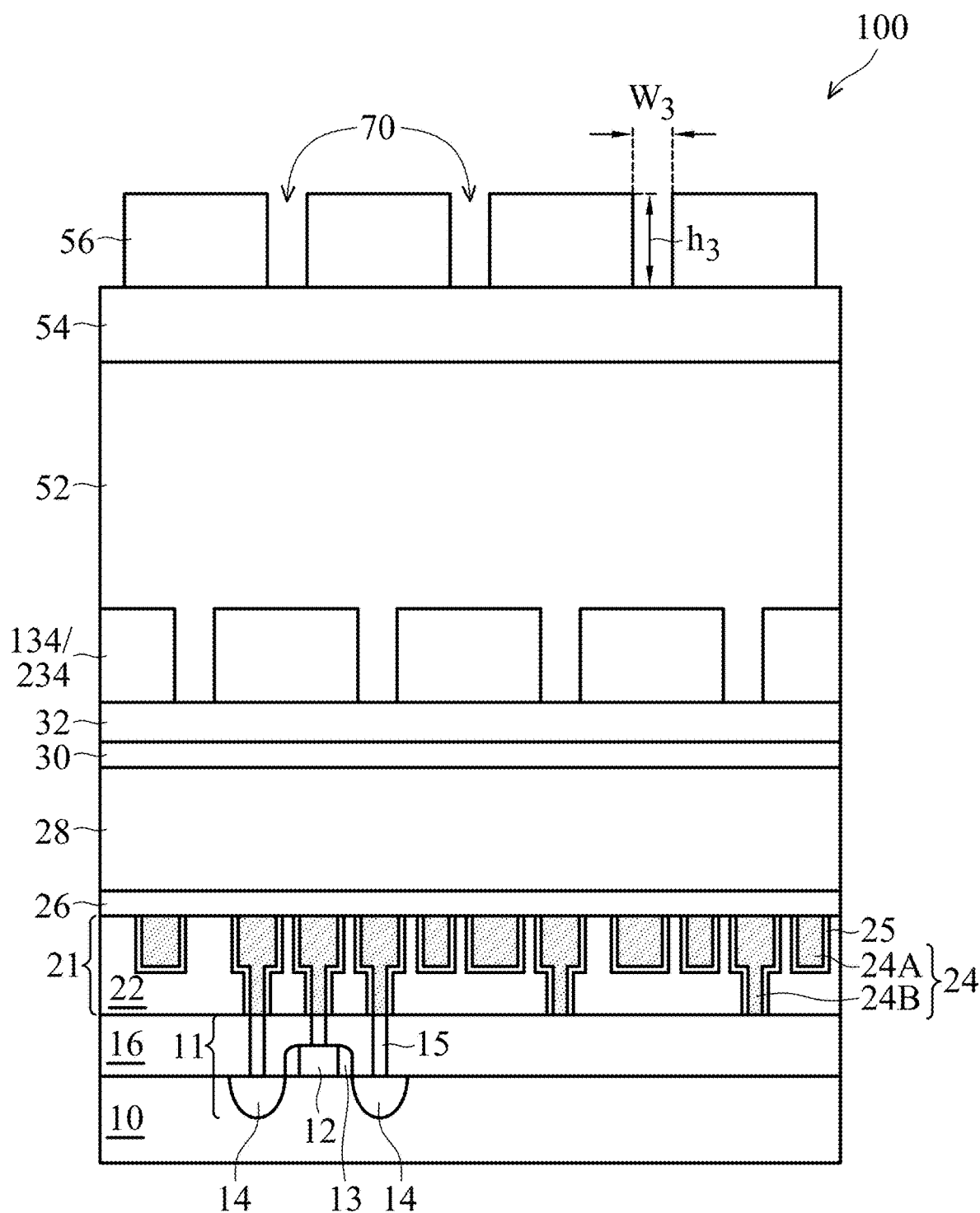

Referring to FIG. 16, the bottom layer 138 of the tri-layer mask is removed and a new tri-layer mask comprising a bottom layer 52, middle layer 54, and top layer 56 is formed over the first patterned mask layer 134. It should be noted that a portion of the bottom layer 52 fills the openings 50 (see FIG. 15) which were formed in the first patterning of the mask layer 134. It should also be noted that the process described for the second patterning can be performed on the structure resulting from FIG. 15A. For the sake of simplicity, the following discussion will refer to the structure in FIG. 15 (except where noted), however, it should be understood that the structure from FIG. 15A could be substituted as appropriate in the following processes.

Still referring to FIG. 16, after the upper layer 56 is formed, upper layer 56 is patterned using an acceptable photolithography technique. The patterned upper layer 56 includes openings 70 therein. In a top view of device 100, openings 70 may have shapes such as strips, round vias, or conductive patterns. Each of the openings 70 has a height-to-width ratio, $h_3:w_3$. In some embodiments, the height $h_3$ of the openings 70 corresponds to the thickness of the top layer 56 and the width $w_3$ of the openings 70 depends on the photolithography technique used to pattern the top layer 56. The width $w_3$ of the openings 70 may be of the same or similar dimensions to the width $w_1$ of the openings 44 of FIG. 12, discussed above.

Figure 17:
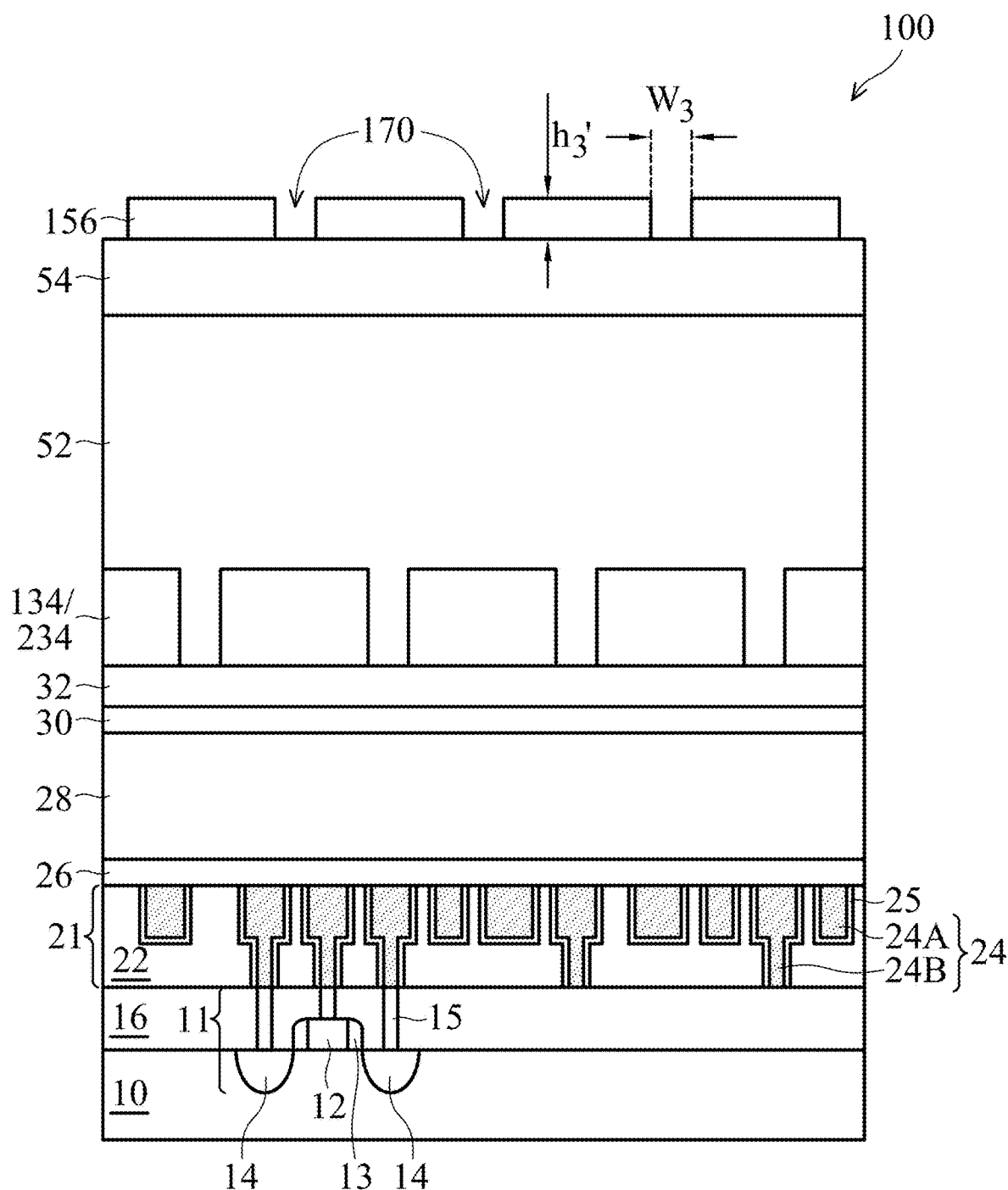

Next, referring to FIG. 17, in order to reduce the height-to-width ratio of the openings 70, the thickness of the upper layer 56 (and corresponding height $h_3$ of the openings 70 of FIG. 16) is reduced to a height $h_3'$ in upper layer 156.

Techniques may correspond to those discussed above with respect to FIG. 2. A corresponding height of the openings 70 is reduced to create openings 170. The reduced height-to-width ratio, $h_3':w_3$, may be between about 0.6 and 2.5, such as about 1.3. In some embodiments, the width $w_3$ may be changed to a width $w_3'$, for example, if the openings 70 of FIG. 16 are also widened in the same process which reduces the height of the upper layer 56. In such embodiments, the resulting height-to-width ratio $h_3':w_3'$ of openings 170 may be reduced over the ratio $h_3:w_3$ by an even greater extent.

Figure 18:
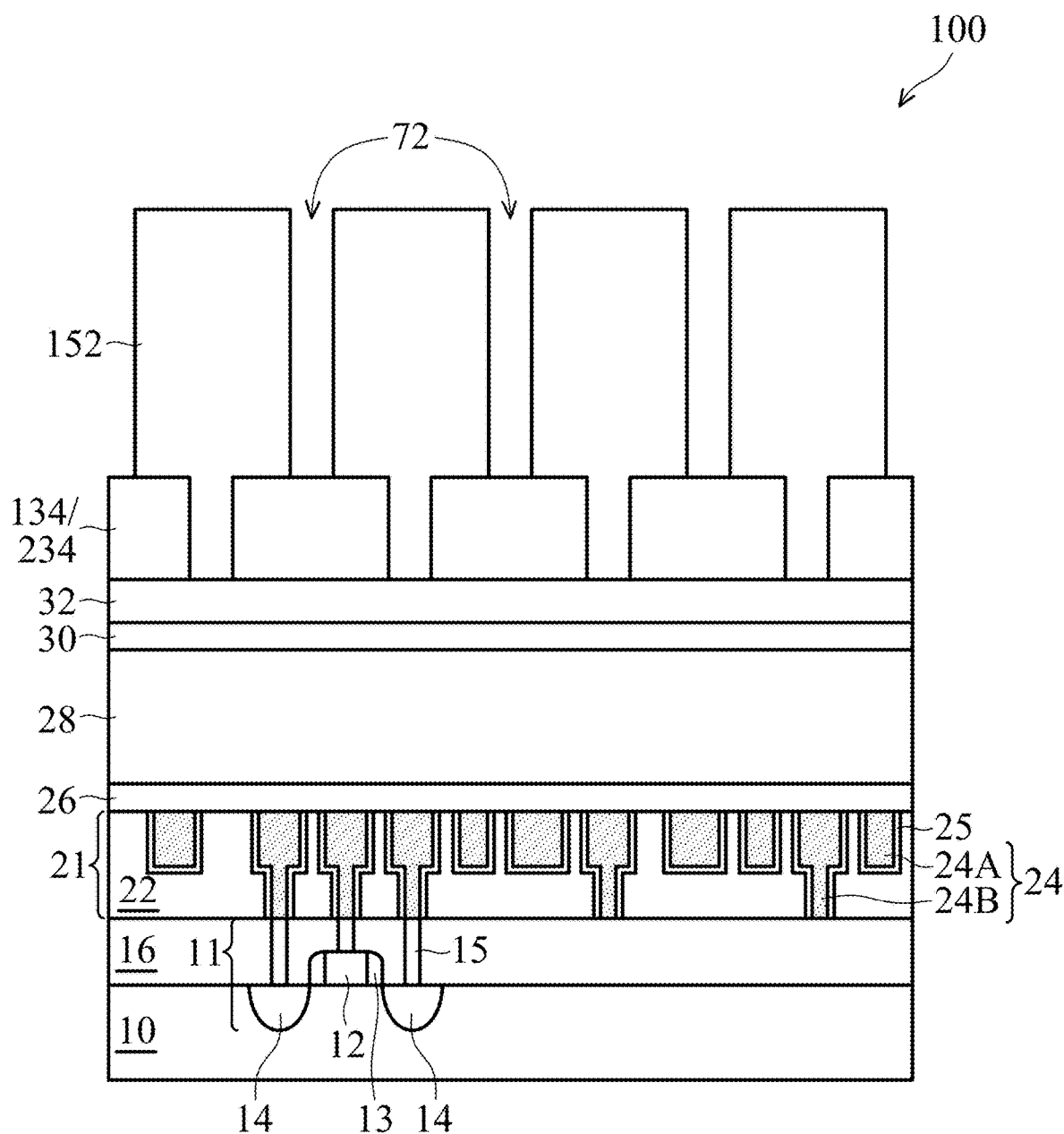

Next, referring to FIG. 18, middle layer 54 is etched to form patterned middle layer 154, which may also be referred to as middle layer 154. Middle layer 54 is etched using the patterned upper layer 156 (FIG. 17) as an etching mask, so that the pattern of upper layer 156 is transferred to middle layer 54 to create patterned middle layer 154. During the patterning of middle layer 54, upper layer 156 may be partially, or entirely, consumed. Etching the middle layer 54 may result in openings in the middle layer 154 which have been extended from openings 170. Any suitable etching technique may be used, such as a wet or dry etch using an etchant which is selective to the middle layer 54 material.

Next, the bottom layer 52 is then etched to form patterned bottom layer 152, which may also be referred to as bottom layer 152. Bottom layer 52 is etched using the middle layer 154 as an etching mask, so that the pattern of middle layer 154 is transferred to bottom layer 52 to create a patterned bottom layer 152. The bottom layer 152 has openings 72 which have been extended from openings 70 (FIG. 17). Upper layer 156 will also be fully consumed during the patterning of bottom layer 52 if it has not been fully consumed in the patterning of middle layer 54. The patterning of bottom layer 52 results in patterned bottom layer 152. Openings 72 may be tapered or may have vertical sidewalls, within process variations. Etching techniques and conditions may include those discussed above with respect to FIG. 4 and are not repeated.

Figure 19:
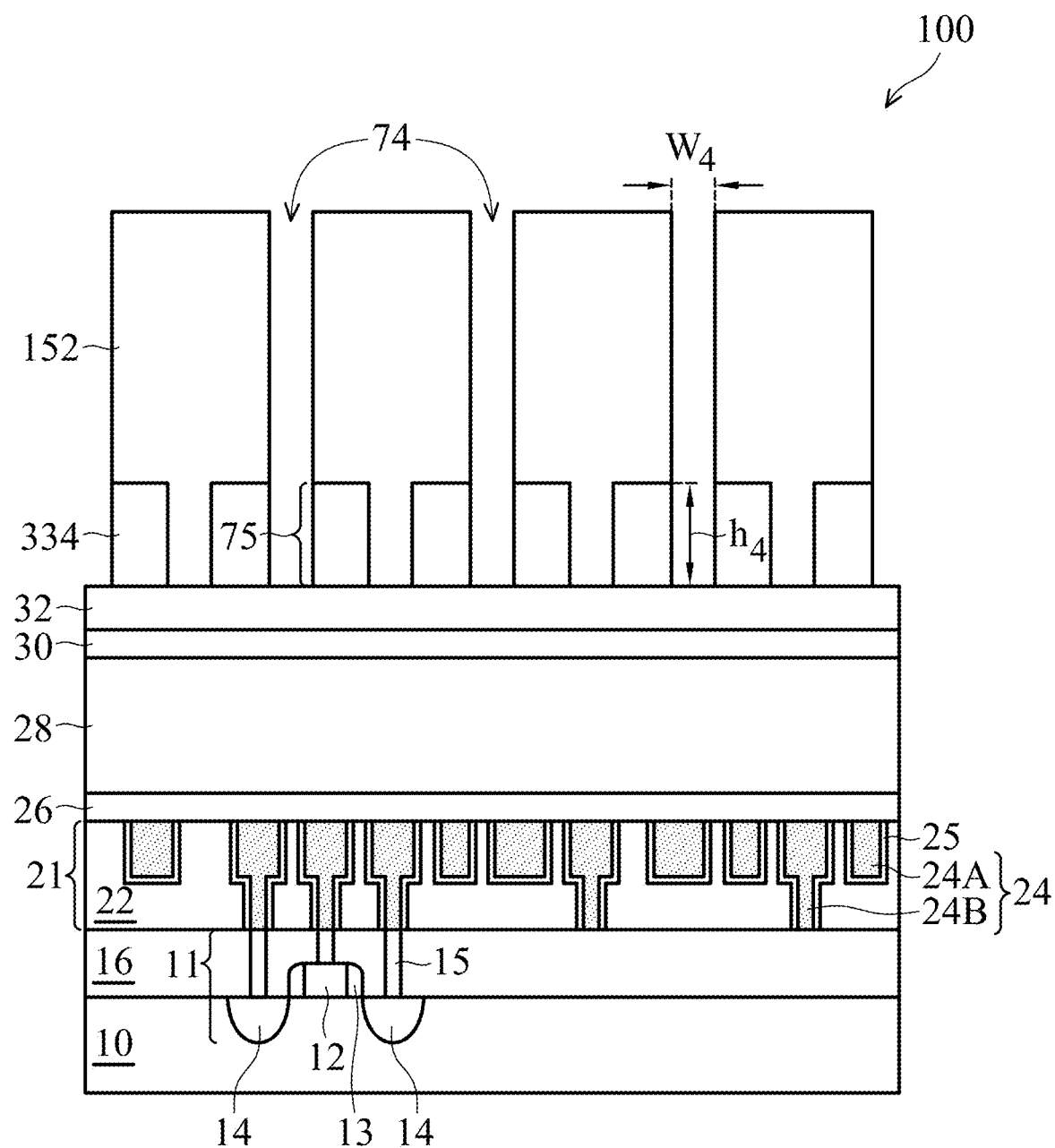

FIG. 19 illustrates an anisotropic etching of mask layer 134 of FIG. 15 (or mask layer 234 of FIG. 15A) to form double patterned mask layer 334, which may also be referred to as mask layer 334. Mask layer 134 is etched using the patterned bottom layer 138 as an etching mask, so that the pattern of bottom layer 138 is transferred to mask layer 134 to create a patterned mask layer 336. The mask layer 334 has openings 74 which have been extended from openings 72 (FIG. 18). The etching technique may include a dry etch using a suitable etchant. Mask layer 32 under the double patterned mask layer 334 may serve as an etch stop layer for the etching through of the material of double patterned mask layer 334. Openings 75 are portions of the openings 74 in the double patterned mask layer 334 that have a height $h_4$ and width $w_4$, where the height $h_4$ corresponds to the thickness of the layer 334 and the width $w_4$ corresponds to the width $w_4$, being approximately equal to the width $w_3$ or $w_3'$, within process variations. A resulting ratio of the height-to-width, $h_4:w_4$, may be about 0.8 to about 3.0, such as about 1.6.

Figure 19A:
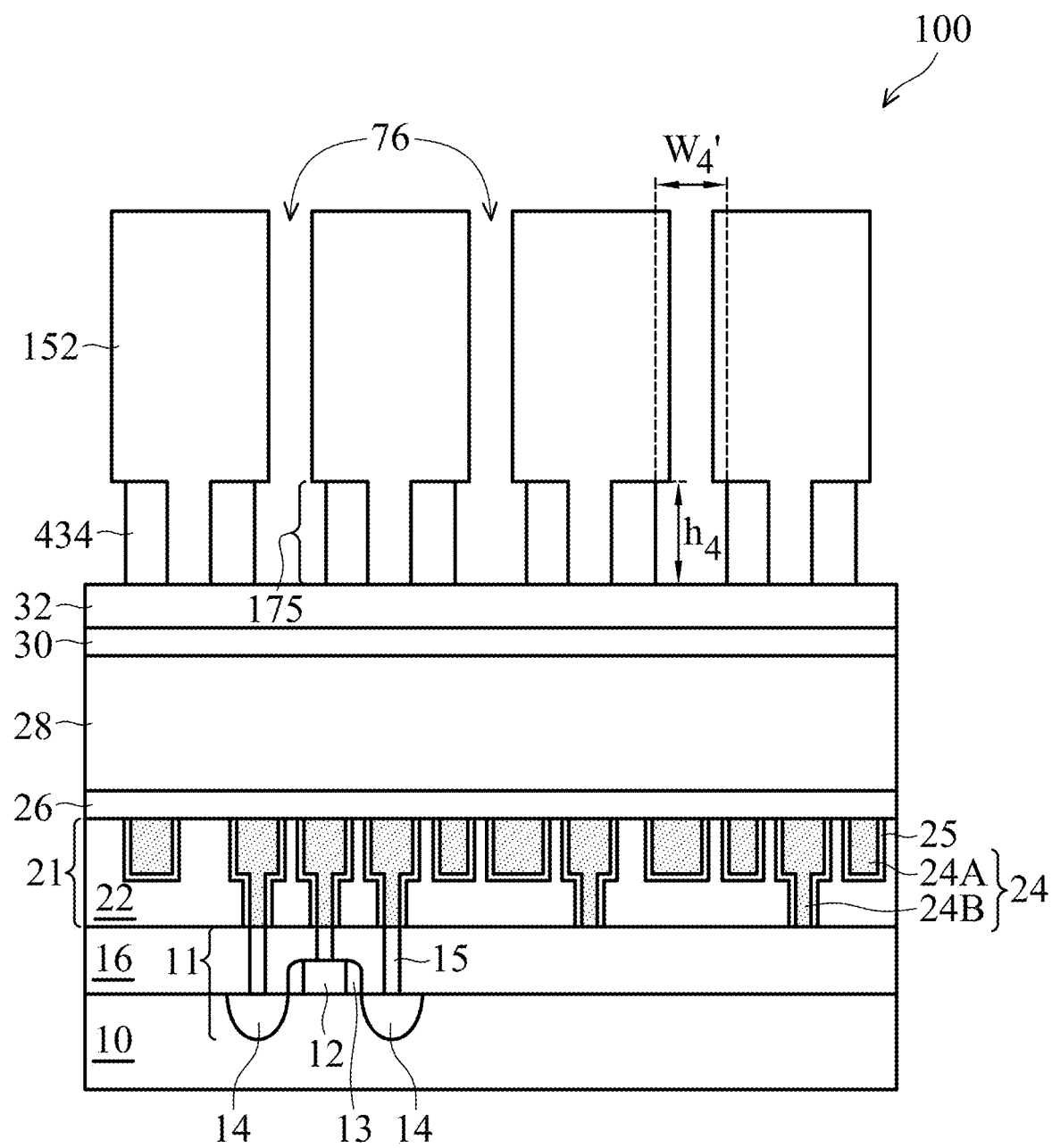

Referring to FIG. 19A, in some embodiments, the openings 75 may be widened into the openings 175 by etching the mask layer 334 into the modified mask layer 434 which may also be referred to as mask layer 434. The openings 175 may be widened to have a width $w_4'$ to reduce the height-to-width ratio from $h_4:w_4$ to $h_4:w_4'$. In embodiments where a first widening in the layer 134 was performed to produce layer 234 (see FIG. 15A), each of the remaining portions of the mask layer 434 will then have been thinned from each side.

Figure 19B:
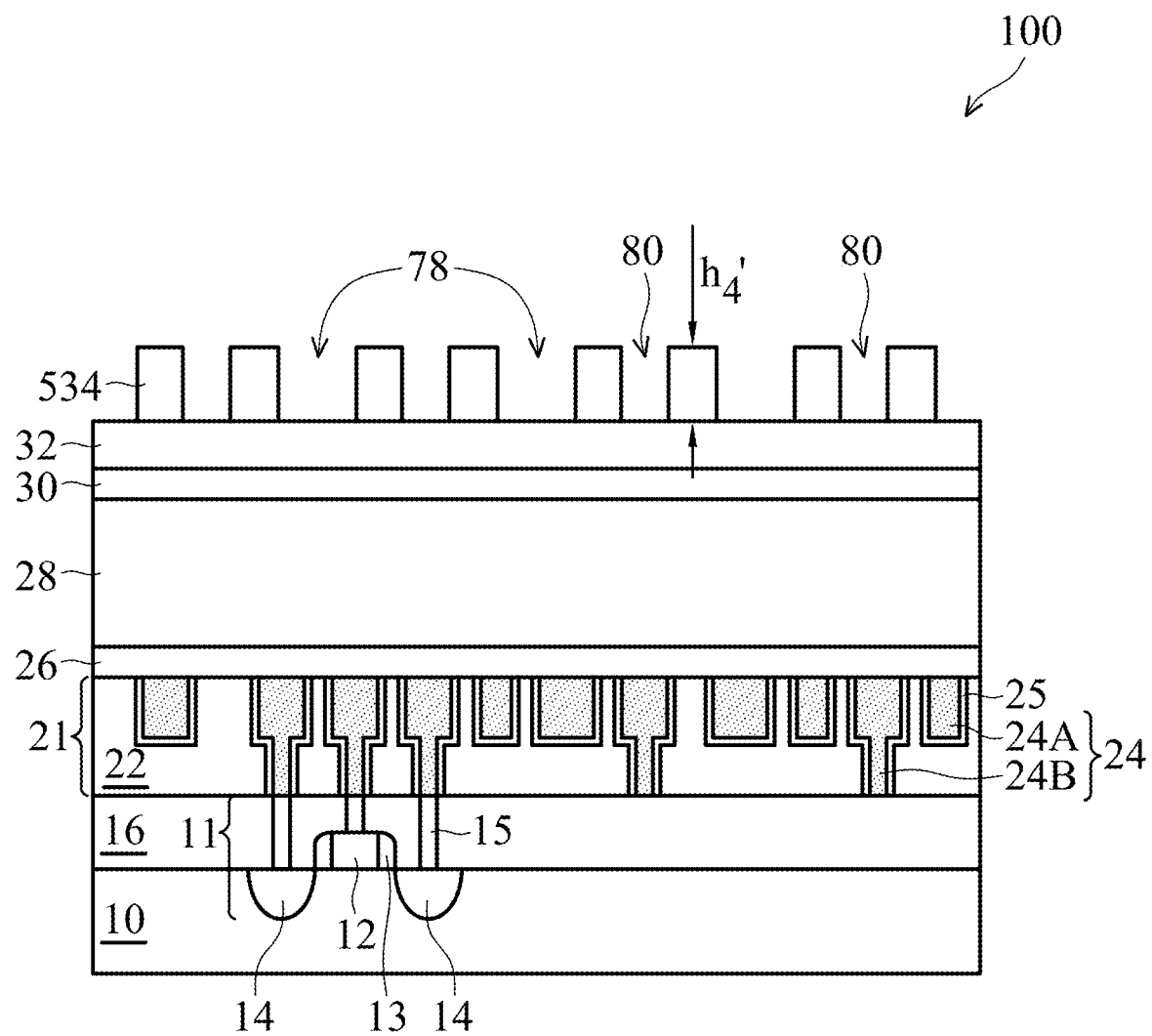

Referring to FIG. 19B, the bottom layer 152 of the tri-layer mask has been removed. Removing the bottom layer 152 of the tri-layer mask exposes the first patterned openings 50 (FIG. 15). Subsequently, FIG. 19B illustrates that in some embodiments the mask layer 334 or 434 may be reduced in thickness to provide openings 78 (from the second patterning openings 75 (FIG. 19) or 175 (FIG. 19A)) and openings 80 (from the first patterning openings 51 (FIG. 15 or 151 (FIG. 15A)), having a new height $h_4'$. The reduction of the thickness of the mask layer 334 or 434 to produce oxide layer 534 may result in a further reduced height-to-width ratio of the openings 78 and openings 80. The height-to-width ratio may be reduced for the openings 78 from $h_4:w_4$ (or $w_4'$) to $h_4':w_4$ (or $w_4'$). A resulting ratio of the height-to-width, $h_4':w_4$ (or $w_4'$), may be about 0.4 to about 2.5, such as about 0.8. The height-to-width ratio may be reduced for the openings 80 from $h_2:w_2$ (or $w_2'$) (see FIG. 15 or FIG. 15A) to $h_4':w_2$ (or $w_2'$). A resulting ratio of the height-to-width, $h_4':w_2$ (or $w_2'$), may be about 0.4 to about 2.5, such as about 0.8.

The reduced thickness mask layer 534 may be produced by any acceptable technique, including for example, an anisotropic etch with an etchant selective to the material of layer 534.

Figure 19C:
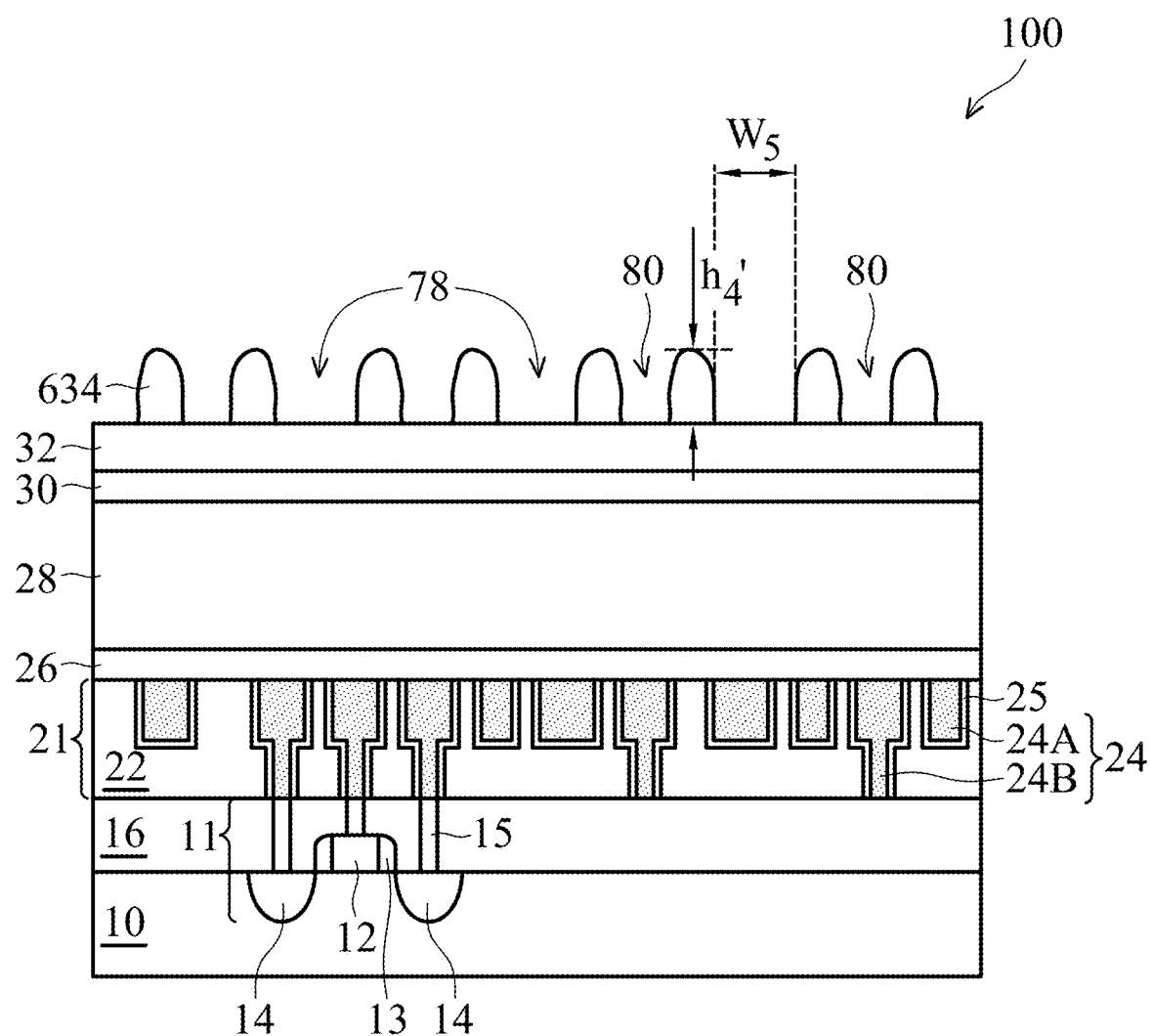

Referring now to FIG. 19C, in some embodiments the mask layer 634 may be produced which has both a reduced thickness and widened openings. The process illustrated by FIG. 19C may be performed following the process at FIG. 19, FIG. 19A, or FIG. 19B. In other words, embodiments which utilize the process illustrated by FIG. 19C may be combined with the embodiments which utilize the process illustrated by FIG. 19A or FIG. 19B, but such combination is not required. The bottom layer 152 of the tri-layer mask (see, e.g., FIG. 19) has been removed, exposing the first patterned openings 50 (FIG. 15) which correspond to the openings 80. Subsequently, the openings 78 and openings 80 may be widened to width $w_5$ by performing a wet etch to remove material from the top and sidewalls of the double patterned mask layer 334 (or 434 or 534). The etching also reduces the thickness of the double patterned mask layer 334 which shortens the openings 78 and 80. The height-to-width ratio may be reduced for the openings 78 from $h_4:w_4$ (or $w_4'$) to $h_4':w_5$. A resulting ratio of the height-to-width, $h_4':w_5$, may be about 0.4 to about 2.5, such as about 0.8. The height-to-width ratio may be reduced for the openings 80 from $h_2:w_2$ (or $w_2'$) (see FIG. 15 or FIG. 15A) to $h_4':w_5$. A resulting ratio of the height-to-width, $h_4':w_5$, may be about 0.4 to about 2.5, such as about 0.8.

In some embodiments, the process of FIG. 19C can be followed by the process of FIG. 19B to further reduce the thickness of the double patterned mask layer 634.

Figure 20:
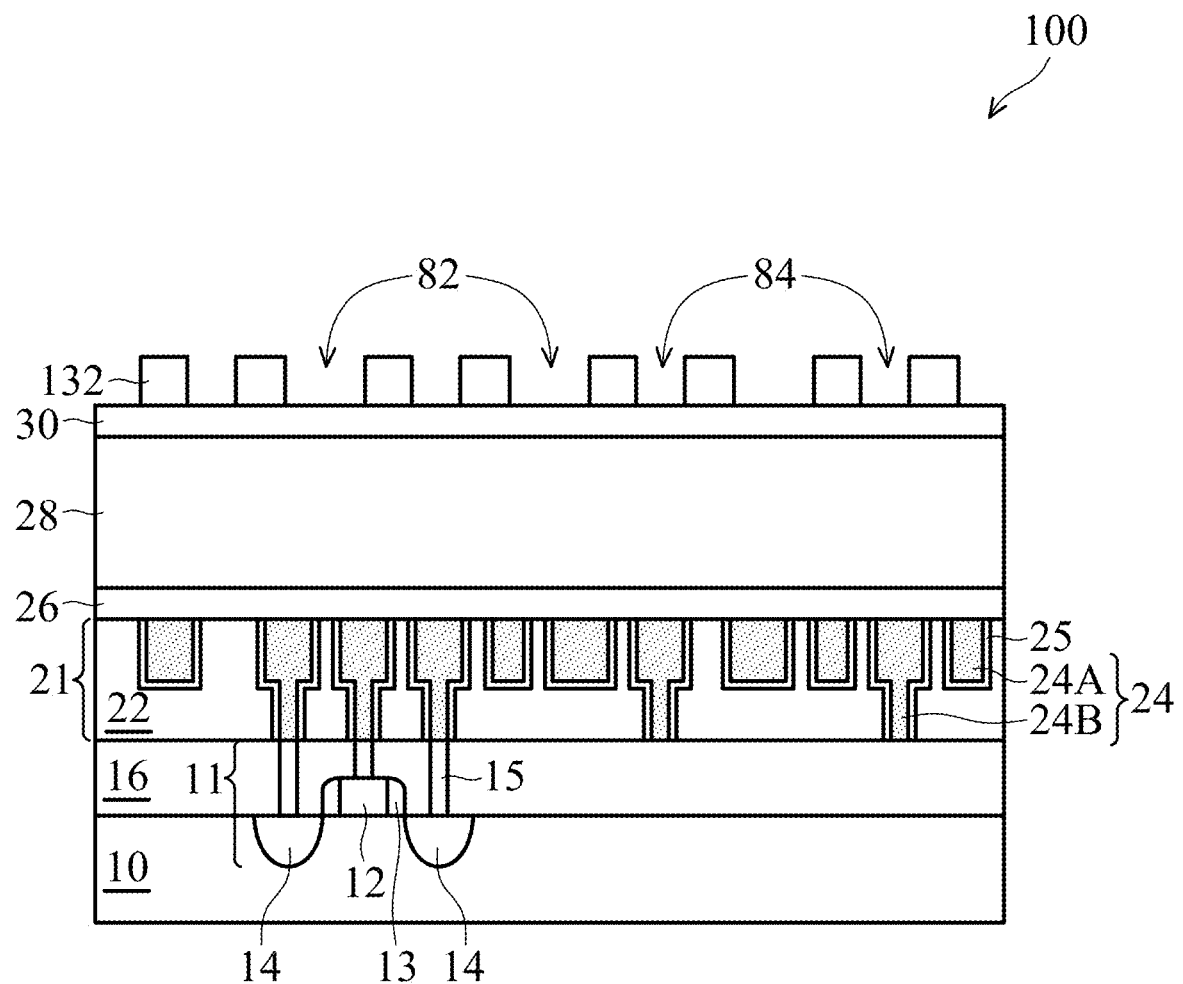

Referring to FIG. 20, following the etching of the double patterned mask layer 334 (or 434 or 534, or 634), mask layer 334 is used to pattern mask layer 32 to form patterned mask layer 132, which may also be referred to as mask layer 132. Mask layer 32 is etched using the double patterned mask layer 334 as an etching mask, so that the pattern of the double patterned mask layer 334 is transferred to mask layer 32 to create a patterned mask layer 132. The mask layer 132 has openings 82 (resulting from the second patterning) extending from openings 78 and openings 84 (resulting from the first patterning) extending from openings 80 in mask layer 132. The etchant and etching technique used can be selective to the mask layer 132.

Figure 21:
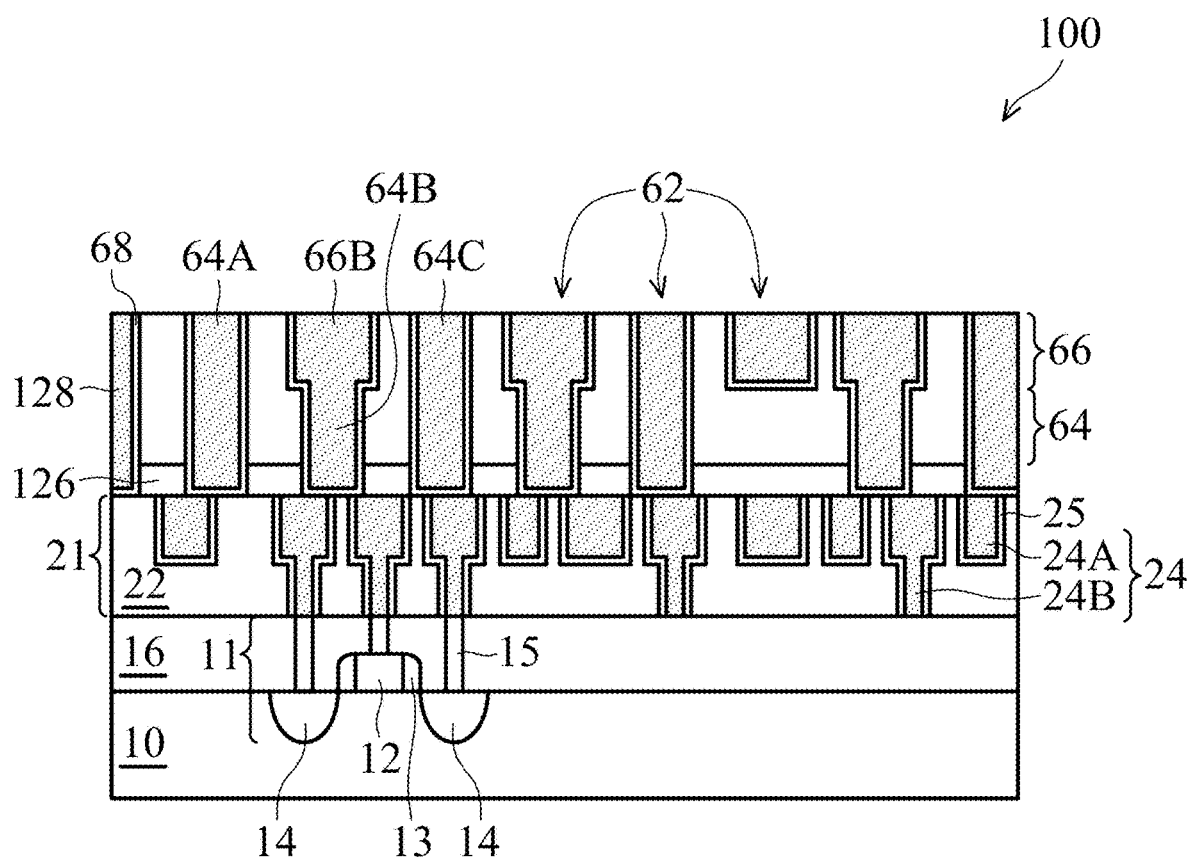

In FIG. 21, the patterned mask layer 132 is used as an etching mask to progressively transfer the pattern of patterned mask layer 132 to the underlying mask 30, low-k dielectric target layer 28, and etch stop layer 26 by etching each layer in turn, using one or more of the previous layers as a mask. Openings 62 are formed by extending openings 82 and 84 into the underlying layers corresponding to openings to be filled with metal lines and vias. In some embodiments, prior to using mask 132 as a mask in etching the underlying layers, the remaining portions of double patterned mask layer 334 may be removed by a separate process. In some embodiments, the remaining portions of double patterned mask layer 334 may be removed simultaneously with etching mask layer 30. The target layer 128 and etch stop layer 126 may be etched using a suitable etching technique such as a wet or dry etch using an appropriate etchant which is selective to the respective materials to be etched. In particular, target layer 128 may be etched using a plasma or RIE anisotropic etch using etch stop layer 26 as an etch stop so that the widths of the resulting trenches are relatively uniform within process variations. Then, in a subsequent process, etch stop layer 26 (e.g., 26A and 26B) may be etched using the target layer 128, patterned hard mask 30, or metal hard mask 132 as a mask to expose the metal features 24. The openings formed in the target layer 128 may include trenches and/or vias. For example, vias may reach the exposed metal features 24, while trenches may be formed to have a bottom which is between the topmost surface of the target layer 128 and the bottommost surface of the target layer 128.

As a result of the lower aspect ratio of the top layer 142 (FIG. 12) and top layer 156 (FIG. 17) of the tri-layer and subsequent widening of the openings in the double patterned oxide layer 334, the double patterned oxide layer 334 can have substantially straight (non-wiggly) sidewalls, in a top down view, which result in the subsequent openings formed in the target layer 28 likewise having substantially straight sidewalls. In some embodiments, each of the etchings described above with respect to FIGS. 16-21 can be performed in the same etching chamber without removing the device 100 between intermediate steps.

FIG. 21 also illustrates the formation of conductive vias 64A, 64B, and 64C (collectively referred to as vias 64) in openings in the target layer 28 (of FIG. 20). These features can be formed using materials and processes similar to those discussed above with respect to FIG. 11, which are not repeated. The cross-sectional view of FIG. 21 may be, for example, along the line A-A of FIG. 22.

In subsequent steps, an additional dielectric ESL layer (not shown) may be formed, and more low-k dielectric layers, metal lines, and vias (not shown) may be formed over the additional dielectric ESL layer. The process steps and resulting structures may be similar to what are shown in FIGS. 12 through 21.

Figure 22:
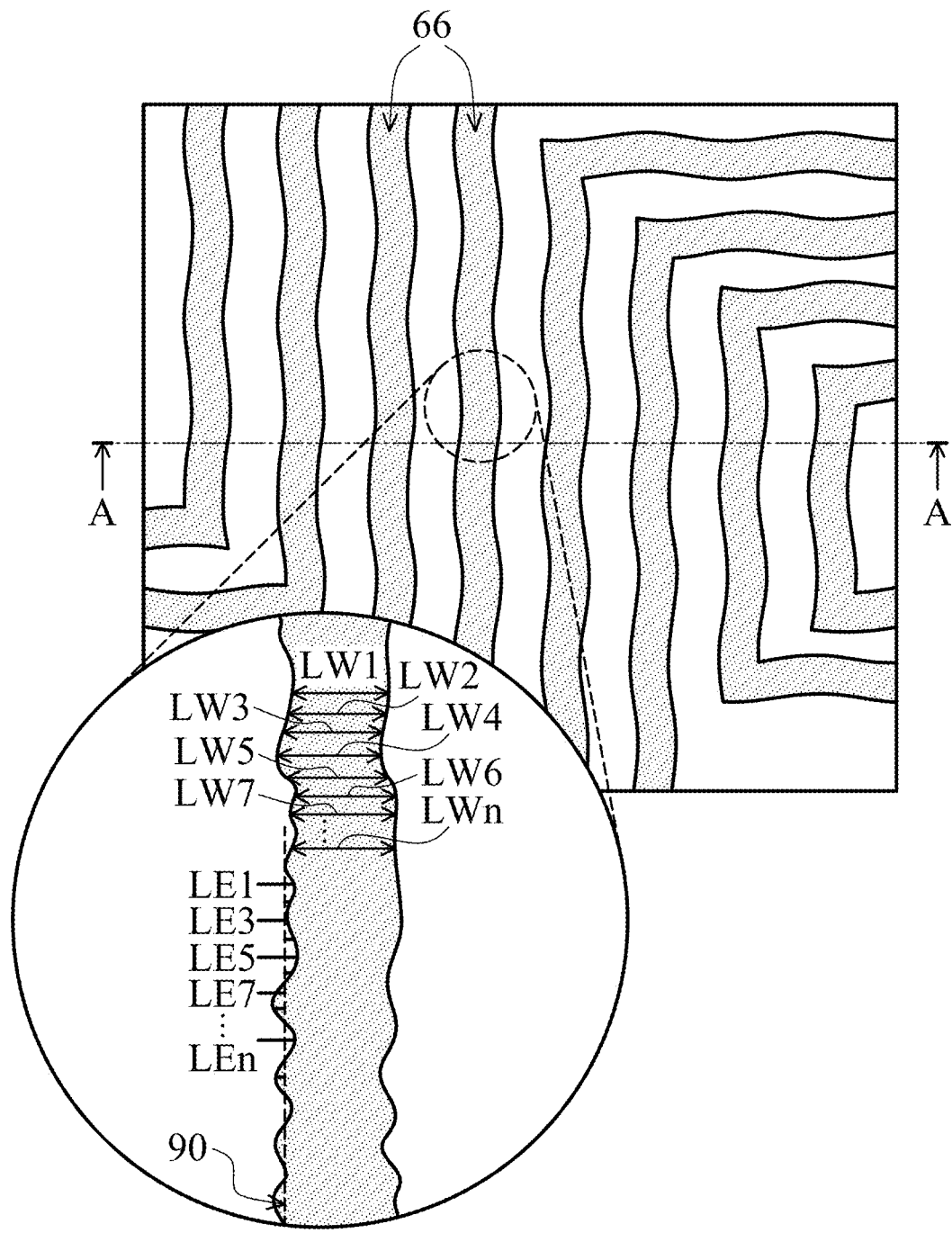
FIG. 22 illustrates a top-down view of a series of metal lines having reduced wiggle which are formed according to a pattern, in accordance with some embodiments.

FIG. 22 illustrates a top down view of the conductive lines 66 following the planarization discussed with reference to FIG. 11 and FIG. 21. The wiggle characteristic of a portion of the line 66 may be illustrated by equation 1.

$$\text{Line wiggle} = \sqrt{\frac{1}{2}(LER_{right})^2 + \frac{1}{2}(LER_{left})^2 - \frac{1}{4}(LWR)^2} \quad \text{(eq. 1)}$$

In equation 1, $LER_{right}$ corresponds to a measurement of line edge roughness on one side (i.e., the right side) of the line, $LER_{left}$ corresponds to a measurement of line edge roughness on the other side (i.e., the left side) of the line, and LWR corresponds to a measurement of line width roughness (variation or unevenness), within a section of the line 66. LWR is determined based on the combined measurements LW1 through LWn measured in one or more segments of the line 66. LWR is a statistical measure of the variation in the width of the line at multiple points along the length of the one or more line segments. LWR represents high frequency variation of the line.

LER is determined based on the combined measurements LE1 through LEn measured in the one or more segments of the line. These measurements are taken for the left side ($LER_{left}$) and right side ($LER_{right}$) of the line for each of the one or more segments of the line. The value for each measurement LE1 through LEn is a variation from a reference line 90 near the edge of the metal line. In some embodiments, reference line 90 may be a line of best fit or average line for the edge profile. LER represents both high frequency and low frequency variations of the edges of the line. Measurements used for LWR and LER calculations can be taken in a top down view of the line 66, for example by analyzing a top-view image from a critical dimension scanning electron microscope (CD-SEM). The statistical measures for determining LWR and LER from raw measurements LWx and LEx, respectively, can be calculated using known techniques. For example, LWR and LER may be selected to be the 1-sigma ($\sigma$) standard deviation values for the respective measurements. Other measures may be used. Eq. 1 for line wiggle is a mathematical combination of the LWR and LER measurements representing multiple characteristic factors for the line wiggling.

Embodiments can produce a line 66 having a line wiggle between about 0.7 and about 1.3, such as about 1.1, as determined by Eq. 1. In testing, using embodiments as described above, line wiggling was reduced from a value greater than 2.0 to 1.3. In another example, line wiggling was reduced from a value of 1.4 to a value of 1.1. Line wiggling can be reduced by about 20 to 60%, such as about 40% using embodiments described above. In addition to such objective measurements, subjectively, low frequency distortion of the metal lines are reduced using embodiments described above as viewed, for example, in a top down CD-SEM image.

Figure 23:
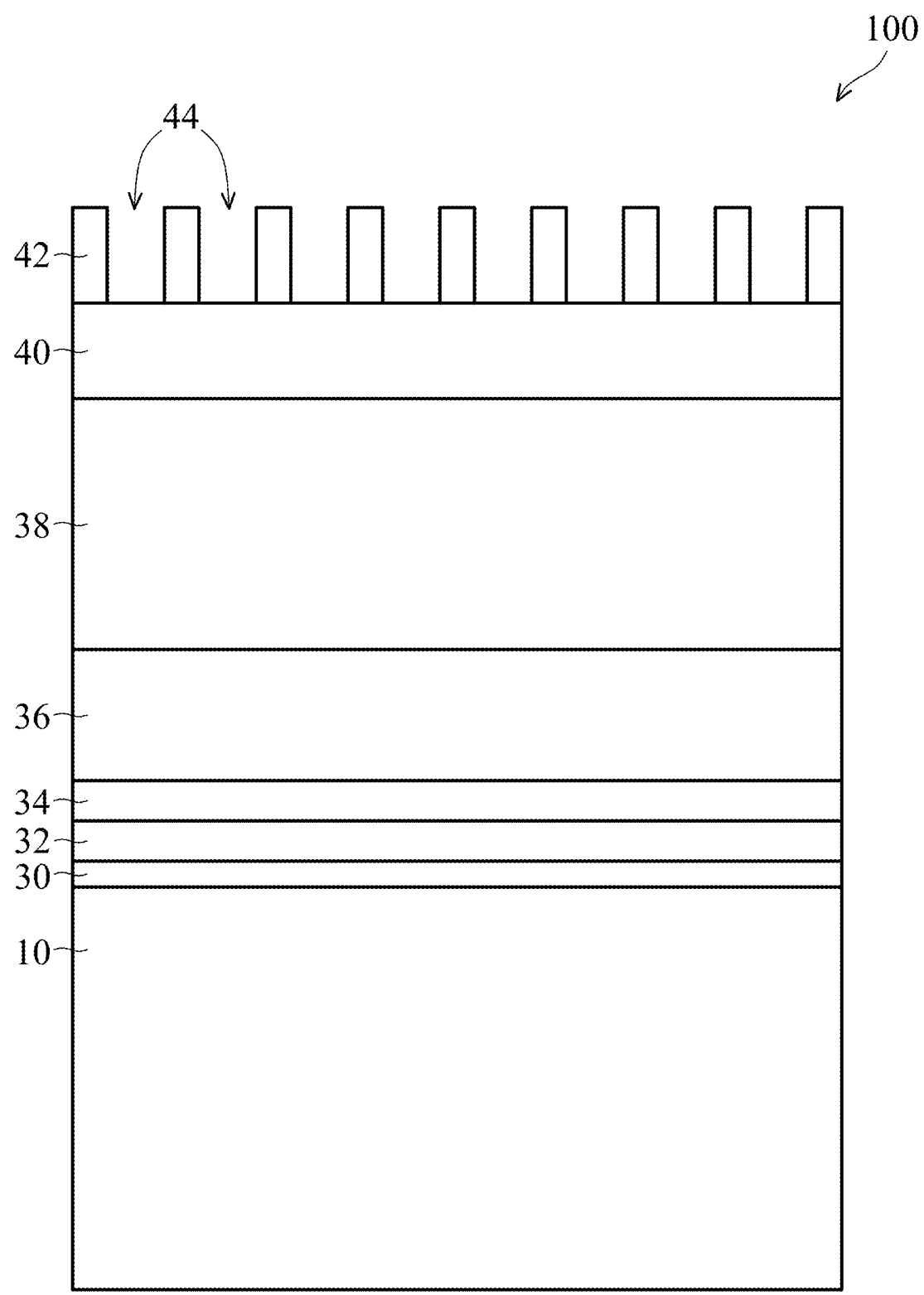
FIGS. 23-24 illustrate intermediate steps of a method for forming semiconductor strips in a semiconductor substrate, in accordance with some embodiments.
Figure 24:
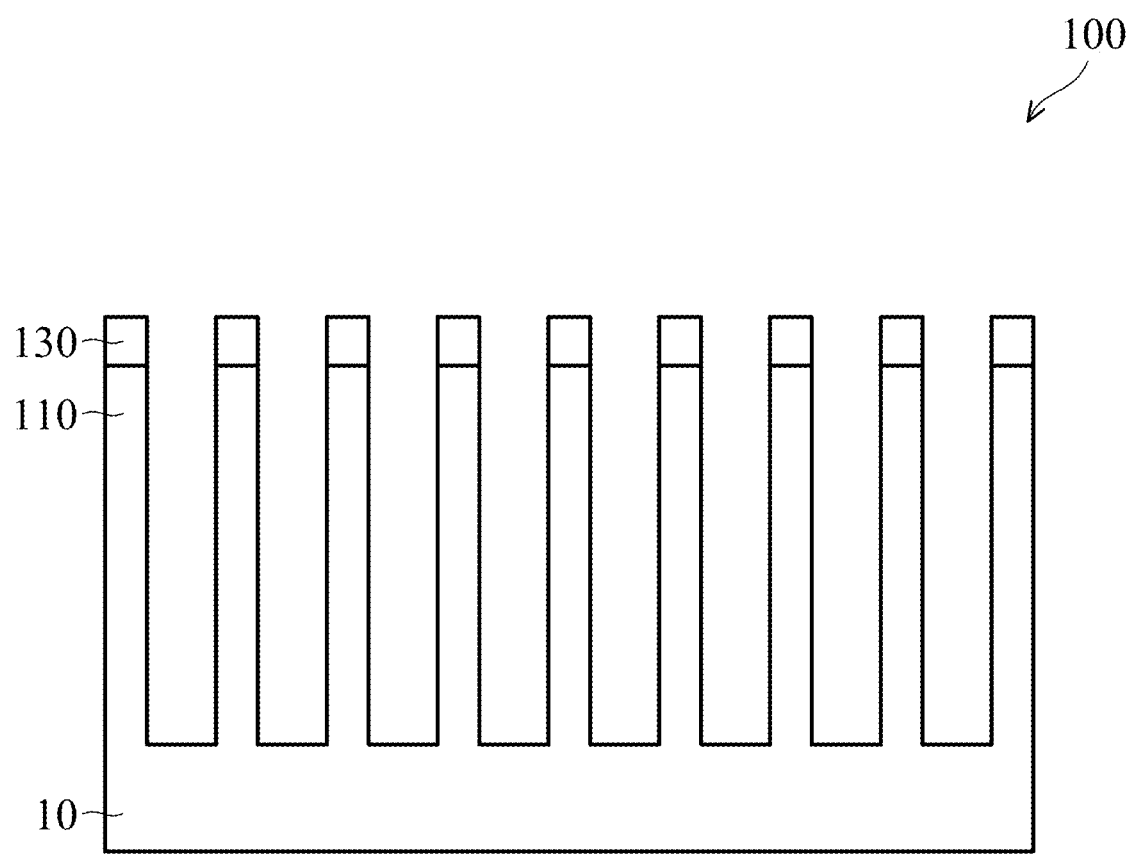

FIGS. 23 and 24 illustrate patterning of a substrate in accordance with some embodiments. FIG. 23 illustrates a substrate 10 which will be subsequently patterned to form fins as part of one or more fin field-effect transistors (FinFETs). The layers presented in FIG. 23 may be the same or similar to those depicted in FIG. 1 or FIG. 12, except that no active devices are yet formed in the substrate 10. The steps to pattern the patterned mask layer 36 (FIG. 1) or patterned mask layer 34 (FIG. 12) may follow as described above with respect to FIGS. 1-6B or FIGS. 12-19C. In some embodiments, one or more of mask layer 30, mask layer 32, and mask layer 34 may be omitted. In some embodiments, the semiconductor substrate 10 may be considered to replace layer 36 (FIG. 1) or layer 34 (FIG. 12), omitting the following layers. The mask layer 30, mask layer 32, and mask layer 34 may be patterned using processes and materials such as described above with respect to FIGS. 7-9 or FIGS. 20-21.

Referring to FIG. 24, mask layer 130 (see descriptions accompanying FIGS. 10-11 or FIGS. 20-21), may be used to pattern the substrate 10 to form semiconductor strips 110. As a result of using the process described above, the semiconductor strips 110 may be formed such that they have reduced wiggle.

Following the formation of semiconductor strips 110, the semiconductor strips 110 may be used to form a FinFET device, such as transistor 11 (FIG. 1). In particular, a gate structure, such as gate electrode 12 and gate spacers 13 of FIG. 1, may be formed over the semiconductor strips 110, perpendicular to the direction of the semiconductor strips 110. Source/drain regions, such as source/drain regions 14 of FIG. 1, may be formed adjacent to the gate structure. Transistor contacts 15 (gate contact and source/drain contacts) may be formed to contact the transistor 11.

Embodiments disclosed herein provide a way to create metal lines in devices at fine pitches having less wiggle than in other techniques. Eliminating or reducing wiggle provides for more reliable interconnects at finer pitch widths.

One embodiment includes a method which includes forming a first patterning layer over a metal feature. A first mask layer is deposited over the first patterning layer. Next, the first mask layer is patterned to form a first set of one or more openings therein. The first mask layer is then thinned. The pattern of the first mask layer is transferred to the first patterning layer to form a second set of one or more openings therein. The first patterning layer is etched to widen the second set of one or more openings.

Another embodiment includes a method which includes forming a dielectric layer over a substrate, where the substrate contains one or more active devices. A first patterning layer is formed over the dielectric layer. A first tri-layer is formed over the first patterning layer, where the first tri-layer includes a top layer of a first material, a middle layer of a second material, and a bottom layer of a third material. The top layer is patterned to form a first set of openings and then the top layer is thinned to decrease a height-to-width ratio of the first set of openings. The transferring the pattern of the top layer is transferred to the middle layer to form a second set of openings, and the pattern of the middle layer is transferred to the bottom layer to form a third set of openings. The first patterning layer is etched through the third set of openings to form a fourth set of openings, which are then widened.

Another embodiment is a device which includes a substrate having one or more active devices formed therein and a contact coupled to a first active device of the one or more active devices. The device also includes an interconnect over the contact, where the interconnect includes a metal line coupled to the contact. The metal line has a first portion which overlaps the contact, where the first portion of the metal line has a wiggle characteristic. The wiggle characteristic of the first portion of the metal line is calculated by $\sqrt{\frac{1}{2}(LER_{right})^2 + \frac{1}{2}(LER_{left})^2 - \frac{1}{4}(LWR)^2}$, where $LER_{right}$ corresponds to a measurement of line edge roughness of a right side of the first portion of the metal line, $LER_{left}$ corresponds to a measurement of line edge roughness of a left side of the first portion of the metal line, and LWR corresponds to a measurement of line width roughness of the first portion of the metal line, wherein the wiggle characteristic is between 0.7 and 1.3.

Another embodiment is a method including forming a first patterning layer over a first metal feature, depositing a first mask layer over the first patterning layer, and patterning the first mask layer to form a first set of openings therein. The pattern of the first mask layer is transferred to the first patterning layer to form a second set of openings. The patterning layer is etched to widen the second set of openings at a rate greater than the first set of openings so that after etching the first patterning layer, a width of the second set of openings is greater than a width of the first set of openings, where the second set of openings is widened while the first mask layer is over the first patterning layer. A target layer is etched based on the first patterning layer to form a third set of openings therein. A conductive material is deposited in the third set of openings to form a second metal feature, the second metal feature electrically coupled to the first metal feature.

Another embodiment is a method including forming a dielectric layer over a substrate, where the substrate contains one or more active devices, forming a first patterning layer over the dielectric layer, and forming a first tri-layer over the first patterning layer, where the first tri-layer includes a top layer of a first photo-patternable material, a middle layer, and a bottom layer. The top layer is patterned using a photolithographic process to form a first pattern in the top layer and the top layer is thinned to decrease a height-to-width ratio of the first pattern. The first pattern of the top layer is transferred to the middle layer to form a second pattern in the middle layer and the second pattern of the middle layer is transferred to the bottom layer to form a third pattern in the bottom layer. The first patterning layer is etched using the third pattern as a mask to transfer the third pattern of the bottom layer to the first patterning layer to form a fourth pattern in the first patterning layer. The sidewalls of the fourth pattern are etched to thin sidewall-to-sidewall thicknesses of the fourth pattern. The dielectric layer is etched based on the fourth pattern. A first opening is formed in the dielectric layer and a first conductor is formed in the first opening, the first conductor electrically coupled to an active device of the substrate.

Another embodiment is a method including forming a first patterning layer over a first metal feature and depositing a first mask layer over the first patterning layer. The first mask layer is patterned to form a first pattern therefrom. The first pattern is transferred to the first patterning layer to form a second pattern therefrom. The second pattern is etched while the first pattern is over the second pattern to thin sidewall-to-sidewall thicknesses of the second pattern, where the second pattern is thinned at a faster rate than the first pattern such that sidewall-to-sidewall thicknesses of portions of the second pattern are less than sidewall-to-sidewall thicknesses of corresponding portions of the first pattern. A target layer is etched based on the second pattern to form a first set of openings therein. A conductive material is deposited in the first set of openings to form a second metal feature, the second metal feature electrically coupled to the first metal feature.

Another embodiment is a method including depositing a first mask over a first patterning layer. The method also includes forming a first set of openings in the first mask. The method also includes forming a second set of openings in the first patterning layer by extending the first set of openings into the first patterning layer. The method also includes widening the second set of openings at a rate greater than widening the first set of openings, while the first mask is over the first patterning layer. The method also includes using the first patterning layer in a patterning process to pattern an underlying dielectric layer.

Another embodiment is a method including forming a first patterning layer over a first metal feature. The method also includes depositing a first mask layer over the first patterning layer. The method also includes patterning the first mask layer to form a first pattern in the first mask layer. The method also includes transferring the first pattern to the first patterning layer to form a second pattern in the first patterning layer. The method also includes etching the first patterning layer through the first pattern while the first mask layer is over the first patterning layer to laterally thin the second pattern to form a third pattern in the first patterning layer. The method also includes etching a target layer, including etching the target layer based on the third pattern to form a first set of openings in the target layer. The method also includes depositing a conductive material in the first set of openings to form a second metal feature, the second metal feature electrically coupled to the first metal feature.

Another embodiment is a method including etching an opening in a dielectric layer, the opening exposing a contact. The method also includes depositing a metal line in the opening, the metal line coupled to the contact, the metal line having a first portion which overlaps the contact, where the first portion of the metal line has a wiggle characteristic, wherein the wiggle characteristic of the first portion of the metal line comprises $\sqrt{\frac{1}{2}(LER_{right})^2 + \frac{1}{2}(LER_{left})^2 - \frac{1}{4}(LWR)^2}$, where $LER_{right}$ corresponds to a measurement of line edge roughness of a right side of the first portion of the metal line, $LER_{left}$ corresponds to a measurement of line edge roughness of a left side of the first portion of the metal line, and LWR corresponds to a measurement of line width roughness of the first portion of the metal line, where the wiggle characteristic is between 0.7 and 1.3.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a first mask over a first patterning layer, the first mask having a first thickness as deposited, wherein the first mask is comprised of one or more sub-masks;
   forming a first set of openings extending to a first depth in the first mask, the first set of openings having respective bottoms defined by a surface of the first mask material;
   thinning the first mask to a second thickness, less than the first thickness, after the step of forming a first set of openings in the first mask and before a step of forming a set of extended openings in the first mask, wherein at least a portion of each sub-mask of the one or more sub-masks remains after the step of thinning the first mask;
   after thinning the first mask, forming the set of extended openings in the first mask by etching the surface of the first mask material, the set of extended openings extending from the first depth to a second depth greater than the first depth;
   after forming the set of extended openings in the first mask, forming a second set of openings in the first patterning layer by extending the set of extended openings into the first patterning layer, the second set of openings being defined by respective opening sidewalls of the first patterning layer;
   widening the second set of openings at a rate greater than widening the first set of extended openings, while at least a portion of the first mask is over the first patterning layer;
   using the first patterning layer in a patterning process to pattern an underlying layer; and removing the first mask.

2. The method of claim 1, wherein the step of depositing the first mask over the first patterning layer includes depositing a plurality of sub-masks over the first patterning layer.

3. The method of claim 2, wherein the step of thinning the first mask to a second thickness, less than the first thickness, comprises thinning a top sub-mask of the plurality of sub-masks followed by patterning an underlying sub-mask of the plurality of sub-masks through the top sub-mask.

4. The method of claim 1, wherein the patterning process further comprises:
removing the first mask;
after widening the second set of openings, depositing a second mask over the first patterning layer;
forming a third set of openings in the second mask;
forming a fourth set of openings in the first patterning layer by extending the third set of openings into the first patterning layer;
widening the fourth set of openings at a rate greater than widening the third set of openings, while the second mask is over the first patterning layer; and
removing the second mask.

5. The method of claim 4, wherein the second mask is deposited in the second set of openings.

6. The method of claim 4, wherein widening the second set of openings forms a first pattern in the first patterning layer, wherein the third set of openings are interspersed among the first pattern.

7. The method of claim 1, wherein after widening the second set of openings, sidewalls the first patterning layer are non-vertical.

8. The method of claim 1, wherein the underlying layer is a semiconductor substrate.

9. The method of claim 1, further comprising: forming a metal line in the patterned underlying layer, wherein the metal line has a wiggle characteristic, wherein the wiggle characteristic of the first portion of the metal line comprises $\sqrt{\frac{1}{2}(LER_{right})^2 + \frac{1}{2}(LER_{left})^2 - \frac{1}{4}(LWR)^2}$, wherein $LER_{right}$ corresponds to a measurement of line edge roughness of a right side of the first portion of the metal line, $LER_{left}$ corresponds to a measurement of line edge roughness of a left side of the first portion of the metal line, and LWR corresponds to a measurement of line width roughness of the first portion of the metal line, wherein the wiggle characteristic is between 0.7 and 1.3.

10. A method, comprising:
forming a first patterning layer over a first metal feature;
depositing a first mask layer on the first patterning layer;
patterning the first mask layer to form a first pattern of first trenches having a first nominal width in the first mask layer;
transferring the first pattern of first trenches to the first patterning layer to form a second pattern of second trenches having a second nominal width in the first patterning layer, wherein the first nominal width is equal to the second nominal width after the transferring step;
etching the first patterning layer through the first pattern while the first mask layer is over the first patterning layer to laterally thin the second pattern to form a third pattern of third trenches in the first patterning layer, respective third trenches having a third nominal width greater than the second nominal width;
etching a target layer, comprising etching the target layer based on the third pattern to form a first set of openings in the target layer; and
depositing a conductive material in the first set of openings to form a metal line, the metal line electrically coupled to the first metal feature, wherein the metal line is a has a wiggle characteristic, wherein the wiggle characteristic of the metal line comprises $\sqrt{\frac{1}{2}(LER_{right})^2 + \frac{1}{2}(LER_{left})^2 - \frac{1}{4}(LWR)^2}$, wherein $LER_{right}$ corresponds to a measurement of line edge roughness of a right side of the metal line, $LER_{left}$ corresponds to a measurement of line edge roughness of a left side of the metal line, and LWR corresponds to a measurement of line width roughness of the metal line, wherein the wiggle characteristic is between 0.7 and 1.3.

11. The method of claim 10, wherein the first mask layer is a bottom layer of a multi-layer photomask.

12. The method of claim 11, wherein the multi-layer photomask has three layers, further comprising:
patterning an upper layer of the multi-layer photomask to form a patterned upper layer; and
thinning the patterned upper layer prior to patterning a middle layer of the multi-layer photomask.

13. The method of claim 10, further comprising:
depositing a spacer layer over the third pattern;
etching the spacer layer to remove horizontal portions of the spacer layer and to form a spacer pattern from vertical portions of the spacer layer;
removing the third pattern, the spacer pattern remaining; and
etching the target layer based on the spacer pattern to form the first set of openings.

14. The method of claim 10, further comprising:
after forming the third pattern, depositing a second mask layer over the third pattern;
patterning the second mask layer to form a fourth pattern in the second mask layer;
transferring the fourth pattern to the first patterning layer to form a fifth pattern in the first patterning layer; and
etching the first patterning layer through the fourth pattern while the second mask layer is over the first patterning layer to laterally thin the fifth pattern to form a sixth pattern in the first patterning layer.

15. The method of claim 14, further comprising:
removing the second mask layer, wherein after removing the second mask layer, the third pattern and the sixth pattern are exposed in the first patterning layer in a combined pattern; and
wherein etching the target layer further comprises etching the target layer based on the sixth pattern to form the first set of openings in the target layer.

16. The method of claim 10, wherein a first height-to-width ratio of the second pattern is between 0.8 and 3.0, and wherein a second height-to-width ratio of the third pattern decreases from the first height-to-width ratio and is between 0.6 and 2.5.

17. A method comprising:
etching an opening in a dielectric layer, the opening exposing a contact; and
depositing a metal line in the opening, the metal line coupled to the contact, the metal line having a first portion which overlaps the contact, wherein the first portion of the metal line has a wiggle characteristic, wherein the wiggle characteristic of the first portion of the metal line comprises $\sqrt{\frac{1}{2}(LER_{right})^2 + \frac{1}{2}(LER_{left})^2 - \frac{1}{4}(LWR)^2}$, wherein $LER_{right}$ corresponds to a measurement of line edge roughness of a right side of the first portion of the metal line, $LER_{left}$ corresponds to a measurement of line edge roughness of a left side of the first portion of the metal line, and LWR corresponds to a measurement of line width roughness of the first portion of the metal line, wherein the wiggle characteristic is between 0.7 and 1.3.

18. The method of claim 17, wherein the opening is etched through an etch mask, further comprising:
    forming a mask layer over a patterning layer;
    etching a first pattern in the patterning layer;
    laterally thinning the first pattern in the patterning layer, while the mask layer is over the patterning layer;
    removing the mask layer; and
    forming the etch mask based on the first pattern in the patterning layer after laterally thinning the first pattern.

19. The method of claim 17, wherein $LER_{right}$ is calculated based on a straight reference line for the right side of the first portion of the metal line, the straight reference line being a line of best fit.

20. The method of claim 17, wherein LWR is calculated based on discrete measurement points taken along a length of the first portion of the metal line.

\* \* \* \* \*